United States Patent
Kajimoto

(10) Patent No.: US 6,680,866 B2
(45) Date of Patent: Jan. 20, 2004

(54) CLOCK SYNCHRONOUS SEMICONDUCTOR MEMORY DEVICE

(75) Inventor: Takeshi Kajimoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 36 days.

(21) Appl. No.: 10/173,263

(22) Filed: Jun. 18, 2002

(65) Prior Publication Data

US 2003/0067812 A1 Apr. 10, 2003

(30) Foreign Application Priority Data

Oct. 5, 2001 (JP) ........................................ 2001-309718

(51) Int. Cl.⁷ ................................................. G11C 7/00
(52) U.S. Cl. .................. 365/189.01; 365/193; 365/194; 365/233; 711/167; 713/500
(58) Field of Search ............................. 365/189.01, 193, 365/194, 230.03, 233; 711/167; 713/500

(56) References Cited

U.S. PATENT DOCUMENTS

| 6,150,866 A | 11/2000 | Eto et al. |
| 6,226,757 B1 | 5/2001 | Ware et al. |
| 6,393,541 B1 * | 5/2002 | Fujii ........................... 711/167 |
| 2003/0002356 A1 * | 1/2003 | Lee ............................. 365/194 |

FOREIGN PATENT DOCUMENTS

| JP | 10-283059 | 10/1998 |
| JP | 10-283060 | 10/1998 |

* cited by examiner

Primary Examiner—Van Thu Nguyen
(74) Attorney, Agent, or Firm—McDermott, Will & Emery

(57) ABSTRACT

The position information indicating the position of a memory relative to a controller is stored in a position information generating circuit, and the transfer timing of write data transmitted from an input circuit to a write circuit and the activation timing of a latch transfer instructing signal are adjusted according to this position information. Thus, the semiconductor memory device is provided that is capable of taking in and generating the internal write data reliably even when the flight time of a data bus becomes substantially the same as the cycle time of a clock signal.

13 Claims, 17 Drawing Sheets

US 6,680,866 B2

CLOCK SYNCHRONOUS SEMICONDUCTOR MEMORY DEVICE

BACKGROUND OF THE INVENTION

1. Field of the Invention

The present invention relates to a semiconductor memory device, and particularly, to a clock synchronous semiconductor memory device for taking in data and a signal applied externally in synchronization with a clock signal. More specifically, the present invention relates to a circuit arrangement for adjusting a data take-in timing of the clock synchronous semiconductor memory device.

2. Description of the Background Art

FIG. 25 is a schematic diagram representing an overall configuration of a conventional semiconductor memory device. In FIG. 25, a semiconductor memory device 900 includes a memory circuit 902 having a plurality of memory cells, a clock buffer 904 for generating an internal clock signal according to a clock signal CLK applied externally, a main control circuit 906 for taking in an externally applied command CMD in synchronization with the internal clock signal generated from clock buffer 904 and generating a variety of control signals required for an operating mode designated by this command, an input/output circuit 910 for transferring data between memory circuit 902 and an external device, and an input/output control circuit 908 for controlling the data input/output operation of input/output circuit 910 under the control of main control circuit 906.

Memory circuit 902 includes a plurality of memory cells arranged in a matrix of rows and columns, a memory cell selecting circuit for selecting a row and a column of memory cells according to an address signal ADD under the control of main control circuit 906, and a write/read circuit for transferring internal data with input/output circuit 910. The memory cell selecting circuit and the write/read circuit are activated in a prescribed sequence under the control of main control circuit 906.

Input/output control circuit 908 controls an external data input operation of input/output circuit 910 according to an externally supplied data strobe signal DQS in a data write operation. In a data output operation, input/output control circuit 908 outputs data strobe signal DQS in synchronization with the data output. Input/output circuit 910 outputs data in synchronization with the internal clock signal in data output operation.

Thus, data strobe signal DQS provides a data take-in timing in the semiconductor memory device in the data write operation, and provides a data take-in timing in an external controller or processor in the data output operation.

Main control circuit 906 decodes an externally supplied command CMD at a rising edge of the internal clock signal generated from clock buffer 904 and generates a variety of control signals necessary for performing the operating mode designated by command CMD. Command CMD includes a plurality of control signals and a specific address signal bit. A command for instructing one operating mode is formed by a combination of logic levels of these signals at the rising edge of clock signal CLK.

FIG. 26 is a schematic diagram representing an arrangement of a data input circuit for one bit of input/output circuit 910 shown in FIG. 25. In FIG. 26, the data input circuit includes a latch circuit 920 for taking in and latching externally supplied data DIN in response to the rise of data strobe signal DQS, a latch circuit 921 for taking in and latching data DIN from outside in response to the fall of data strobe signal DQS, a latch circuit 922 for taking in and latching latch data DILF0 of latch circuit 920 according to a transfer instructing signal DQSDT, a latch circuit 923 for taking in and latching latch data DILF1 of latch circuit 921 according to transfer instructing signal DQSDT, a register circuit 924 for taking in and latching latch data DIL0 of latch circuit 922 in response to a latch transfer instructing signal ZLTTR, and a register circuit 925 for taking in and latching latch data DIL1 of latch circuit 923 according to latch transfer instructing signal ZLTTR.

Transfer instructing signal DQSDT is generated in the form of a one-shot pulse in response to the fall of data strobe signal DQS.

Latch transfer instructing signal ZLTTR is generated in the form of a one-shot pulse in synchronization with the rise of the internal clock signal in the data write operation. The latch data of register circuits 924 and 925 are transferred in parallel to an internal data bus.

In the internal data bus, an even-numbered data bus corresponding to an even-numbered data address and an odd-numbered data bus corresponding to an odd-numbered data address are provided, and the latch data of register circuits 924 and 925 are transferred to these even-/odd-numbered data buses according to a column address signal.

FIG. 27 is a timing chart representing an operation of the data input circuit shown in FIG. 26. The operation of the data input circuit shown in FIG. 26 will be described briefly below with reference to FIG. 27.

In a data write operation, data strobe signal DQS is input in synchronization with clock signal CLK, and write data DIN is input in synchronization with data strobe signal DQS.

Latch circuit 920 takes in and latches external data DIN in response to the rise of data strobe signal DQS, and generates internal latch data DILF0. Latch circuit 921 takes in external data DIN in response to the fall of data strobe signal DQS and generates internal latch data DILF1. In the data write operation, transfer instructing signal DQSDT is generated in the form of a one-shot pulse in response to the fall of data strobe signal DQS, and latch circuits 922 and 923 take-in and latch the latch data DILF0 and DILF1 of latch circuits 920 and 921, respectively.

Then, latch transfer instructing signal ZLTTR is generated in the form of a one-shot pulse in response to the rise of clock signal CLK, and register circuits 924 and 925 take in and latch the latch data DIL0 and DIL1 of latch circuits 922 and 923, respectively.

Thus, by internally converting data DIN transferred externally in synchronization with the rising edge and the falling edge of data strobe signals DQS into parallel data, and thereafter, by internally transferring the converted data in parallel according to latch transfer instructing signal ZLTTR in synchronization with clock signal CLK, the valid period width of internal data DIL0 and DIL1 can be made equal to one clock cycle period of clock signal CLK, thereby achieving a greater effective valid data width.

Memory circuit 902 operates in synchronization with the internal clock signal, and by performing the above-described processing of the data transferred in synchronization with both the rising edge and the falling edge of data strobe signal DQS, the processing (writing/reading) can be performed with one of the edges of clock signal CLK used as a trigger.

The method of employing data strobe signal DQS to take in the data is called a source synchronous scheme. By transferring the data strobe signal via the same path as the data transfer path, even when the delay time of the data transferred from a controller with respect to the clock signal from a clock generating circuit increases to decrease the valid data width, data can be reliably taken into the semiconductor memory device.

The scheme of transferring data in synchronization with both the rising edge and the falling edge of a clock signal is called the DDR (Double Data Rate) mode. The data transferred serially is taken in, latch transfer instructing signal ZLTTR is generated in synchronization with clock signal CLK internally, and the parallel internal write data is generated in synchronization, for instance, with the rising edge of the internal clock signal. In the memory circuit, the writing and reading process can be performed with a sufficient margin with one of the edges of the clock signal used as a trigger. Thus, data can be transferred at a high speed in synchronization with a high-speed clock signal, the data bandwidth can be increased, and the processing efficiency of the system can be improved.

FIG. 28 is a diagram representing an example of an arrangement of a conventional processing system. In FIG. 28, four memories MD0 to MD3 are provided for a controller CLT. These memories MD0 to MD3 can each be a one-chip memory device or a memory module.

A clock signal CLK from a clock generating circuit CGEN is applied in common to controller CLT and these memories MD0 to MD3. Controller CTL generates and transfers a data strobe signal DQS, a command CMD, and write data DQ to memories MD0 to MD3 in a data write operation according to clock signal CLK from the clock generating circuit CGEN. Each of memories MD0 to MD3 operates in synchronization with clock signal CLK from clock generating circuit CGEN supplied to a clock input CK.

In the case of the arrangement of the processing system shown in FIG. 28, the respective distances between controller CTL and memories MD0 to MD3 differ from each other. Thus, when clock signal CLK is generated from clock generating circuit CGEN and the propagation time (flight time) of the data from controller CTL becomes long, the phase difference between clock signal CLK and data strobe signal DQS becomes great.

FIG. 29 is a timing chart representing a data write operation of the processing system shown in FIG. 28. FIG. 29 shows an operation in the case in which the burst length is four and four data are written successively with one write command.

Memory MD0 is closest to controller CTL, while memory MD3 is farthest from controller CTL. The delay of data strobe signal DQS from controller CTL with respect to clock signal CLK becomes the greatest in memory MD3.

A write command instructing a data write (denoted by a signal /WE) is supplied as command CMD, and then, data strobe signal DQS is transferred in synchronization with clock signal CLK. As a phase shift of data strobe signal DQS with respect to clock signal CLK, a phase difference of +25% is allowed, for instance.

Therefore, in memory MD0, in the case when a phase difference of ¼ cycle, for instance, exists between clock signal CLK and data strobe signal DQS, when latch transfer instructing signal ZLTTR is generated in response to the rise of clock signal CLK, there is a possibility that adequate hold time for data DIL0 and DIL1 may not be ensured and an accurate internal data transfer cannot be performed.

In memory MD1, the phases of clock signal CLK and data strobe signal DQS substantially coincide with each other, and the internal data can be generated with accuracy according to latch transfer instructing signal ZLTTR for data DIL0 and DIL1. In addition, also in memory MD2, the phase difference of data strobe signal DQS with respect to clock signal CLK is small, and thus, sufficient set up time and hold time of data DIL0 and DIL1 relative to latch transfer instructing signal ZLTTR can be ensured, and the internal data can be generated with accuracy.

In memory MD3, further, data strobe signal DQS is delayed, and the transmission of data DQ is also delayed so that, when latch transfer instructing signal ZLTTR is generated in synchronization with the rise of clock signal CLK, there is a possibility that adequate set up time for data DIL0 and DIL1 cannot be ensured and accurate internal write data cannot be generated.

Here, a write command is allocated with a sufficiently long period for its active state period as indicated by the broken line in FIG. 29, and a skew of the write command relative to clock signal CLK does not affect the command decode operation in memories MD0 to MD3. Thus, the command CMD is decoded accurately and it is determined that the write command is supplied.

As shown in FIG. 29, in the case in which the burst length is four and data D0 to D3 are successively transferred according to one write command, since the transfer time periods of the data and the data strobe signal differ according to the distances between the memories and the controller, the phase differences relative to clock signal CLK differ. Therefore, a possibility arises that the internal data cannot be generated accurately according to the latch transfer instructing signal.

Moreover, in the case where clock signal CLK at an even higher speed is employed, since the propagation delay time (flight time) of the data propagation path in the processing system is the same, the ratio of the phase difference within the clock cycle time becomes greater as the difference between the flight time and the clock cycle time is reduced.

Now, a situation is considered in which the phase of data strobe signal DQS is advanced by a half cycle relative to clock signal CLK as shown in FIG. 30. In this case, a write command is supplied (a write enable signal /WE is set to the logic low or L level), and then, in that clock cycle #0, data strobe signal DQS rises to the logic high or H level, data D0 is taken into a memory, and latch data DIL0 changes to data D0. Thereafter, when data strobe signal DQS falls, latch data DIL0 and DIL1 are provided by data D0 and D1 according to the external data.

Latch transfer instructing signal ZLTTR is generated when two clock cycles have passed since the write command is supplied so that the latch transfer instructing signal is in the inactive state in clock cycle #1, and latch transfer instructing signal ZLTTR attains the active state in clock cycle #2. In clock cycle #2, data D2 and D3 are latched as latch data DIL0 and DIL1, and the latch/transfer operation of the first two data D0 and D1 is not performed.

As shown in FIG. 30, if time tDQSS from the supply of the write command to the rise of data strobe signal DQS becomes short beyond a permitted value, a problem arises in that the initial transferred data cannot be taken in.

In addition, when latch transfer instructing signal ZLTTR is activated in clock cycle #2, if the set up time of latch data DIL0 and DIL1 (D2, D3) is insufficient, accurate internal write data cannot be generated.

Moreover, the case is considered in which data strobe signal DQS is generated with a further delay beyond clock signal CLK, as shown in FIG. 31. In this case, the flight time of data strobe signal DQS is long, and data strobe signal DQS attains the H level in the next clock cycle #1 after the write command is supplied. In other words, the situation in which time tDQSS becomes long is considered.

In this situation, data strobe signal DQS and data DQ are transferred in the same direction, and data DQ is taken in according to the rising edge and the falling edge of data strobe signal DQS, and latch data DILF0, DIL0, and DIL1 are generated. Since latch data DIL0 and DIL1 are generated in response to the fall of data strobe signal DQS, latch data DIL0 and DIL1 are invalid data in clock cycle #1.

In clock cycle #2, latch transfer instructing signal ZLTTR is activated so that internal write data is generated according to data D0 and D1. In this case, also, the set up time of latch data DIL0 and DIL1 relative to latch transfer instructing signal ZLTTR is insufficient so that there is a possibility that the internal write data cannot be generated with stability.

In addition, as shown in FIGS. 30 and 31, since latch transfer instructing signal ZLTTR is activated when a second clock cycle elapses since the write command is supplied, the data in clock cycle #2 differ depending on the phase relation of data strobe signal DQS with clock signal CLK, and the problem arises that the internal write data cannot be accurately generated. In particular, when write commands are successively supplied to write data, it becomes impossible to identify whether the data latched according to the latch transfer instructing signal is the data according to the first write command or the data according to the next write command, and the problem arises that the data write operation cannot be performed accurately according to the position of the memory from the controller.

Moreover, in order accurately to set the data take-in timing, data strobe signal DQS is held at the L level for a prescribed period of time prior to the data writing. The period during which data strobe signal DQS is at the L level is called a preamble.

Thus, in FIG. 32, when issuing a write command, the controller temporarily sets to the L level the data strobe signal DQS that had been held in a high impedance state or at an intermediate voltage level, and thereafter, raises data strobe signal DQS to the H level in synchronization with clock signal CLK.

By prolonging the preamble portion in which data strobe signal DQS is at the L level to one clock cycle period, even in the case where the flight time becomes long, it is possible to identify the starting point of the rise of data strobe signal DQS, i.e., the starting point of data take-in operation. The preamble portion is similarly transmitted along with the propagation of data strobe signal DQS. When such preamble portion of data strobe signal DQS is set to, for instance, one clock cycle period, a memory remote from the controller does not take in the data during this preamble period, and thus, the data take-in timing is delayed. Therefore, when the data write operation is performed for different memories, the writing of data is never performed during this preamble period, and therefore, a problem arises in that the data write operation cannot be performed at a high speed.

In addition, also in the case where the preamble period is made long, the timing at which the preamble period is detected varies among the memories so that the preamble portion of the data strobe signal cannot be accurately detected.

When a clock signal is transferred from the controller to a memory, the flight time of the clock signal becomes equal to the flight time of write data and the data strobe signal so that it might be possible to take in the data in each of the memories without being affected by the flight time of the data. The clock signal, however, is transmitted from the controller to the memories commonly via an on-board wiring line so that there is a need to increase the drivability of the portion for transmitting the clock signal in the controller. The area occupied by the controller becomes larger and the power consumption for generating the clock signal in the controller also increases. Thus, an oscillator such as a crystal oscillator, separate from these memories and the controller, is arranged for generating a clock signal with a large driving power and with accuracy by so as to generate a common system clock for the controller and the memories. Therefore, the problem of the phase differences between the clock signal and the data and between a clock signal and a data strobe signal varying according to the respective distances between the memories and the controller always occurs in an onboard assembled system. In particular, when a high speed clock signal is employed, the flight time and the clock cycle period becomes substantially the same length so that the problem arises that the internal data cannot be accurately transferred in a memory.

SUMMARY OF THE INVENTION

An object of the present invention is to provide a semiconductor memory device capable of accurately performing take-in of data and generation of internal write data in synchronization with a high speed clock signal.

Another object of the present invention is to provide a semiconductor memory device capable of performing take-in of data and generation of internal write data in synchronization with a high speed clock signal with accuracy regardless of the distance from the controller.

A semiconductor memory device according to the present invention includes a position information generating circuit for generating position information indicating a position on the basis of a controller, a data take-in instructing signal generating circuit for adjusting a timing for taking in data supplied from the controller to generate a data take-in instructing signal according to the position information generated from the position information generating circuit and a write instructing signal supplied from the controller, and a write circuit for generating internal data corresponding to the data from the controller according to the data take-in instructing signal.

In the semiconductor memory device, by setting the position information according to the distance relative to the controller and by adjusting the timing for generating the internal write data according to the position information, data can be taken in with accuracy even when the flight time of a signal/data differs according to the position on the basis of the controller. Consequently, in the case where data transfer is performed using a high speed clock signal, the data can be taken in and the internal write data can be generated with accuracy even when the flight time of a signal/data is substantially the same as one clock cycle period of a clock signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
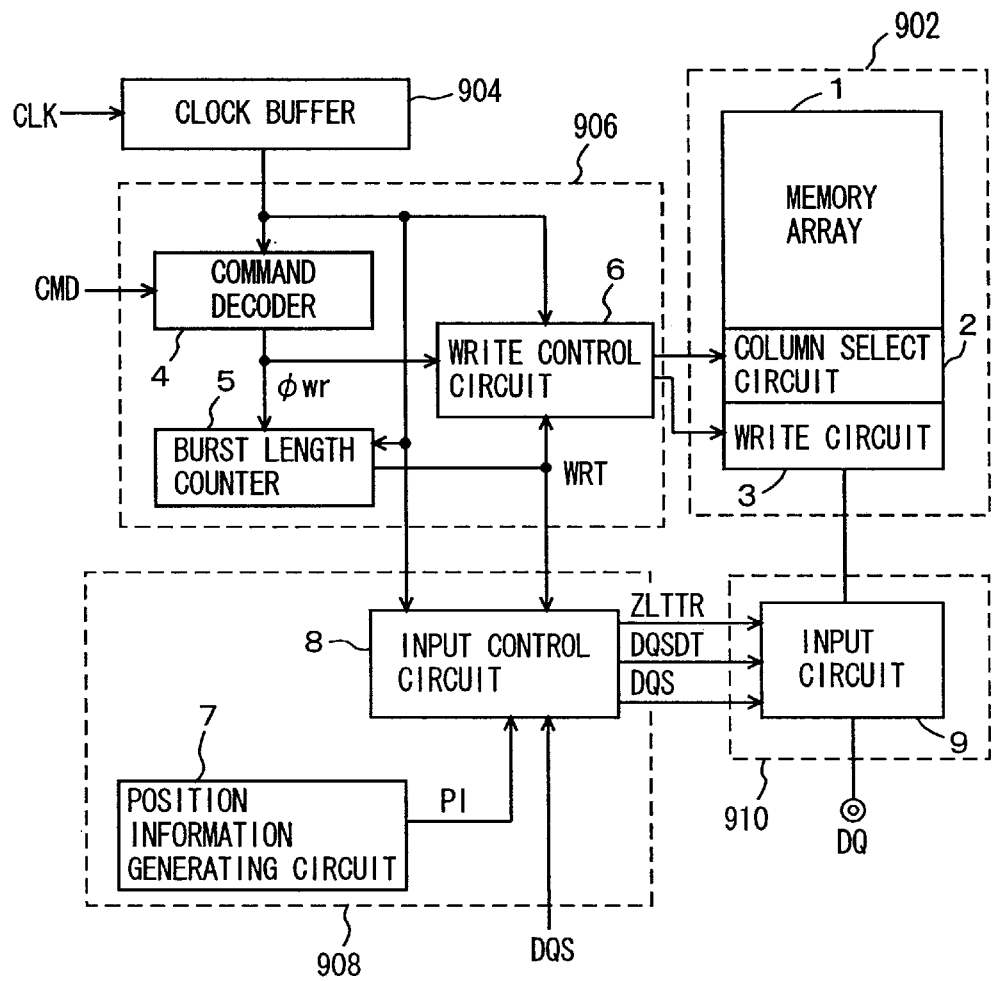
FIG. 1 is a schematic diagram representing an overall configuration of a semiconductor memory device according to the present invention.

FIG. 1 is a schematic diagram representing an arrangement of a main portion of the semiconductor memory device according to the present invention. FIG. 1 shows an arrangement of a portion related to a data write operation.

In FIG. 1, a memory circuit 902 includes a memory array 1 having a plurality of memory cells arranged in rows and columns, a column select circuit 2 for selecting a column of memory array 1 according to a column address signal when activated, and a write circuit 3 for transmitting internal write data to a memory cell column selected by column select circuit 2 and writing data into a selected memory cell when activated.

Column select circuit 2 includes the circuit related to the column selection such as a column address decoder and a column select gate.

Write circuit 3 generates write data for a memory cell according to the internal write data supplied from an input/output circuit 910 and writes the data into a selected column of memory array 1 via an internal data line and column select circuit 2.

A main control circuit 906 includes: a command decoder 4 for taking in and decoding a command CMD at a rising edge of an internal clock signal supplied from a clock buffer 904 and generating an operating mode instructing signal for designating an operating mode designated by command CMD; a burst length counter 5 activated in response to a write operation mode instructing signal φwr from command decoder 4 for counting the internal clock signal, and after one clock cycle passes, for maintaining a write activating signal WRT in an active state during a burst length period; and a write control circuit 6 activated in response to the activation of write operation mode instructing signal φwr from command decoder 4 for generating a control signal necessary for writing during the activation period of write activating signal WRT from burst length counter 5.

Write control circuit 6 controls the operation of column select circuit 2 and write circuit 3 in FIG. 1. Burst length counter 5 counts the rising edge and the falling edge of a clock signal from clock buffer 904 and defines the burst length period. Burst length counter 5 is formed, for instance, by a set/reset flip-flop that is set in response to the activation of write operation mode instructing signal φwr and a shift register for transferring write operation mode instructing signal φwr in synchronization with the rising edge and the falling edge of clock signal CLK. The set/reset flip-flop is reset in response to the activation of an output signal from this shift register. The write activating signal WRT is generated from a one clock cycle delay stage of the shift register.

Write control circuit 6 is activated in response to the activation of write operation mode instructing signal φwr and starts a column select operation. The inactivation of write control circuit 6 is defined by write activating signal WRT.

An input/output control circuit 908 includes a position information generating circuit 7 for generating position information PI indicating a position of a memory on the basis of or relative to a controller, and an input control circuit 8 for generating a data strobe signal DQS, a transfer instructing signal DQSDT, and a latch transfer instructing signal ZLTTR for an input circuit 9 according to position information PI, an internal clock signal, data strobe signal DQS, and write operation activating signal WRT.

In a data write operation, input control circuit 8 generates a data strobe signal DQS and transfer instructing signal DQSDT according to a data strobe signal DQS externally applied, and adjusts the activation timing of latch transfer instructing signal ZLTTR according to position information PI. Thus, in input circuit 9 included in input/output circuit 910, the activation timing of latch transfer instructing signal ZLTTR is adjusted according to position information PI so that the internal write data can be generated internally with accuracy in synchronization with the internal clock signal regardless of the distance between a memory and the controller, i.e., the flight time of the data.

Figure 2:
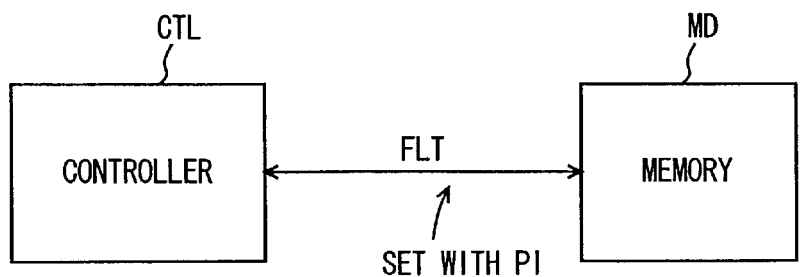
FIG. 2 is a schematic diagram representing a correspondence between a flight time and position information in the present invention.

As shown in FIG. 2, position information PI indicates a distance between a controller CTL and a memory MD, or a flight time FLT of a signal/data. Thus, even when the phase relation between data strobe signal DQS and clock signal CLK differs according to the position of a memory within the system, by adjusting a data latch transfer timing within memory MD so as to compensate for the difference of flight time FLT in accordance with the position information PI, the latch transfer of write data can always be performed at an accurate timing to generate the internal write data in each memory. Consequently, the correspondence between the initial latch transfer instructing signal ZLTTR and the initial internal write data can be made to match, and data can be latched and transferred in each memory without the provision of a long preamble of the data strobe signal. Moreover, since there is no need to provide a long preamble of the data strobe signal, in the case where data is written successively for different memories, the write data can be transferred with successive clocks so that high speed data transfer can be achieved.

Figure 26:
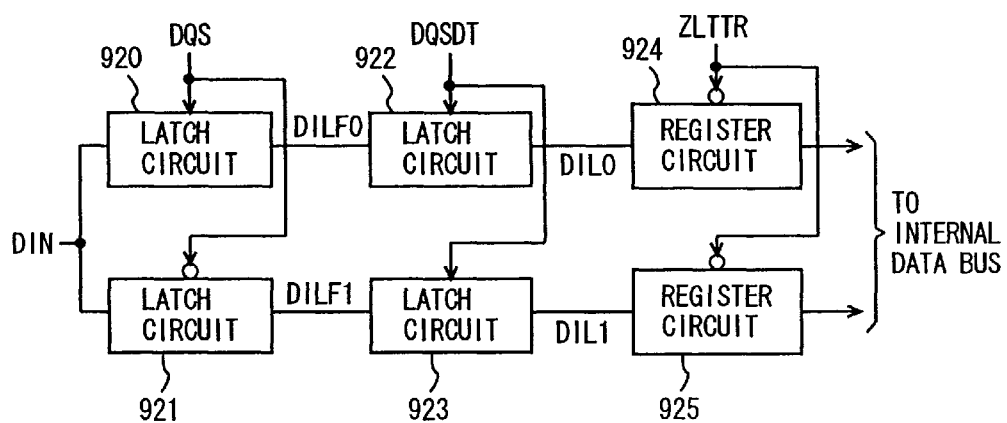
FIG. 26 is a schematic diagram representing an arrangement of an input portion of an input/output circuit shown in FIG. 25.
Figure 27:
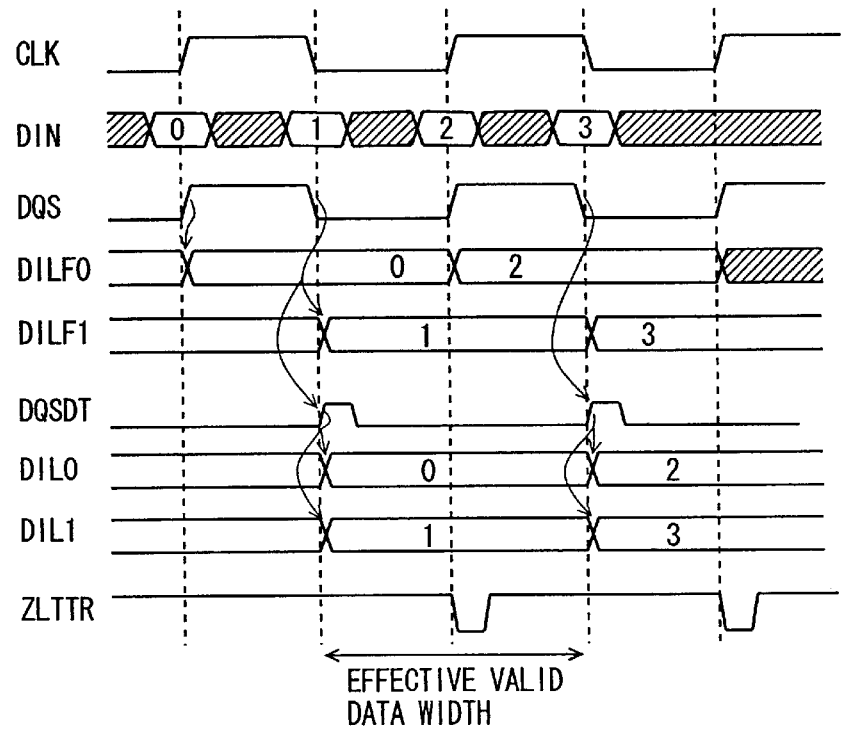
FIG. 27 is a timing chart representing an operation of an input circuit shown in FIG. 26.

Input circuit 9 has a similar arrangement to that shown in FIG. 26, and converts one bit data that is input serially externally into two bit parallel data per data input terminal.

Figure 3:
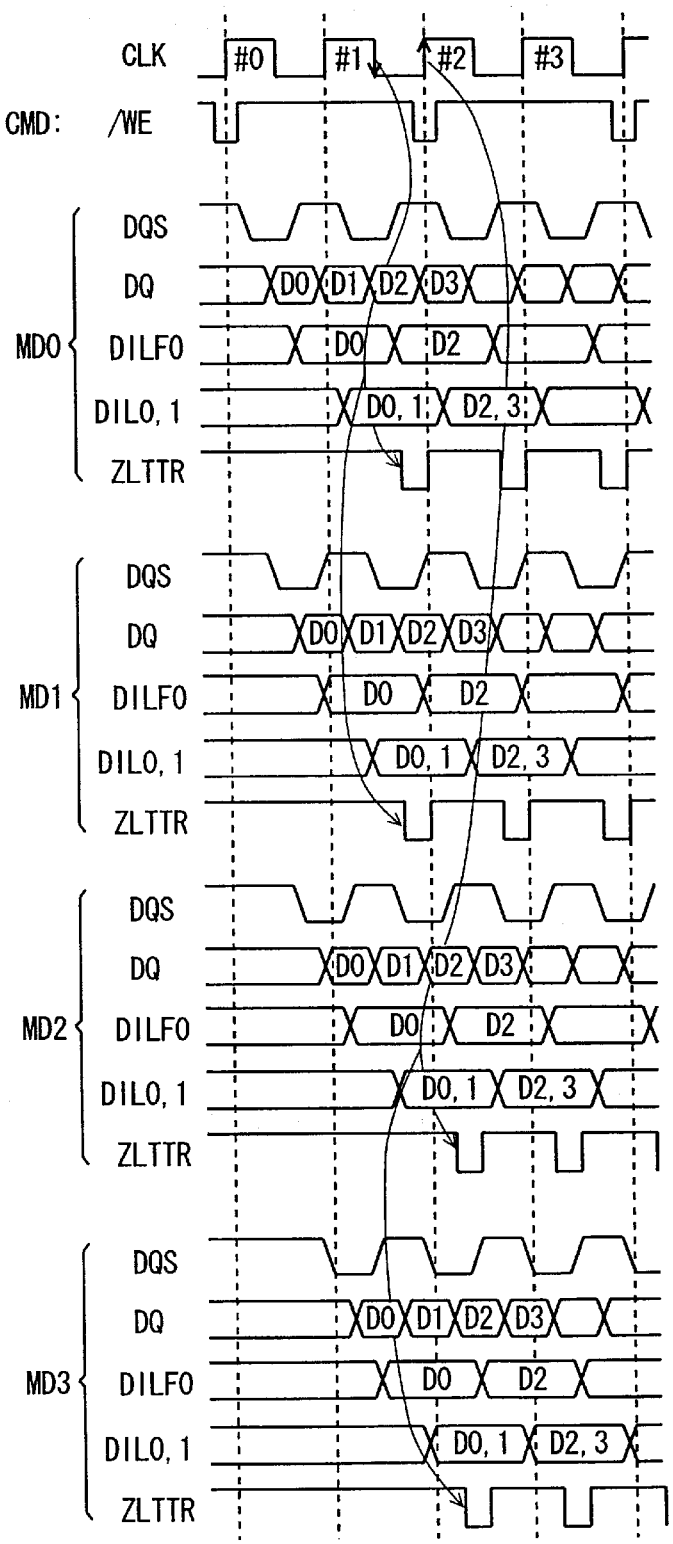
FIG. 3 is a timing chart representing an operation of the semiconductor memory device according to the present invention.
Figure 28:
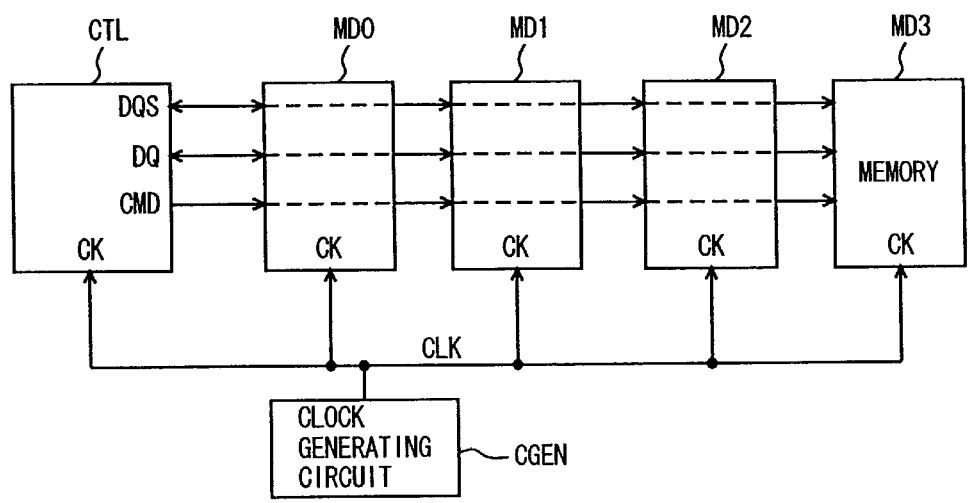
FIG. 28 is a diagram representing an example of an arrangement of a conventional processing system using the semiconductor memory device.

FIG. 3 is a diagram representing a timing of internal write data generation for each of memories MD0 to MD3 in the processing system shown in FIG. 28. Referring to FIG. 3, the internal write data latch and transfer operation according to the first embodiment of the present invention will be described below.

As shown in FIG. 28, the respective distances from controller CTL to memories MD0 to MD3 and therefore the flight time of a signal/data increase in this order, i.e., from memories MD0 toward MD3.

When a write command is supplied and the data write is designated in clock cycle #0, since memories MD0 and MD1 are close to the controller, internal latch data D0 and D1 (D0, 1) attains the definite state in the next clock cycle #1. In this state, latch transfer instructing signal ZLTTR is activated in response to the fall of clock signal CLK in clock cycle #1 according to position information PI, and latch transfer instructing signal ZLTTR is once again activated in response to the fall of clock signal CLK in the next clock cycle #2 as well. Here, an operation is shown of the case where the burst length is four and four data are written with one write command in a data write operation.

On the other hand, memories MD2 and MD3 are farther away from the controller so that latch transfer instructing signal ZLTTR is generated (activated) in response to the rise of clock signal CLK in clock cycle #2. In these memories MD2 and MD3, latch data DIL0 and DIL1 in clock cycle #2 are data D0 and D1. By activating a latch transfer instructing signal ZLTTR in response to the rise of clock signal CLK in this clock cycle #2, the initial data can be latched and transferred with accuracy even when the latch data is different in the second clock cycle due to the long flight time.

Since the burst length is four, latch transfer instructing signal ZLTTR is activated once again in response to the rise of clock signal CLK in the next clock cycle #3 as well.

Thus, when latch transfer instructing signal ZLTTR is initially activated, latch data DIL0 and DIL1 in each of the memories are the first two data D0 and D1, and the first transfer data D0 and D1 can be transferred according to the first latch transfer instructing signal ZLLTR to generate the internal write data regardless of the position of the memory.

Thus, even when the flight time of a signal/data becomes substantially equal to the cycle period of clock signal CLK, the activation timing of latch transfer instructing signal ZLTTR can be adjusted according to position information PI so as to generate the internal write data internally in synchronization with a clock signal with accuracy regardless of the position of the memory, i.e., the flight time of the signal/data. The internal circuitry operates in synchronization with clock signal CLK so that the internal write operation can be performed according to the transferred internal write data with accuracy.

Figure 29:
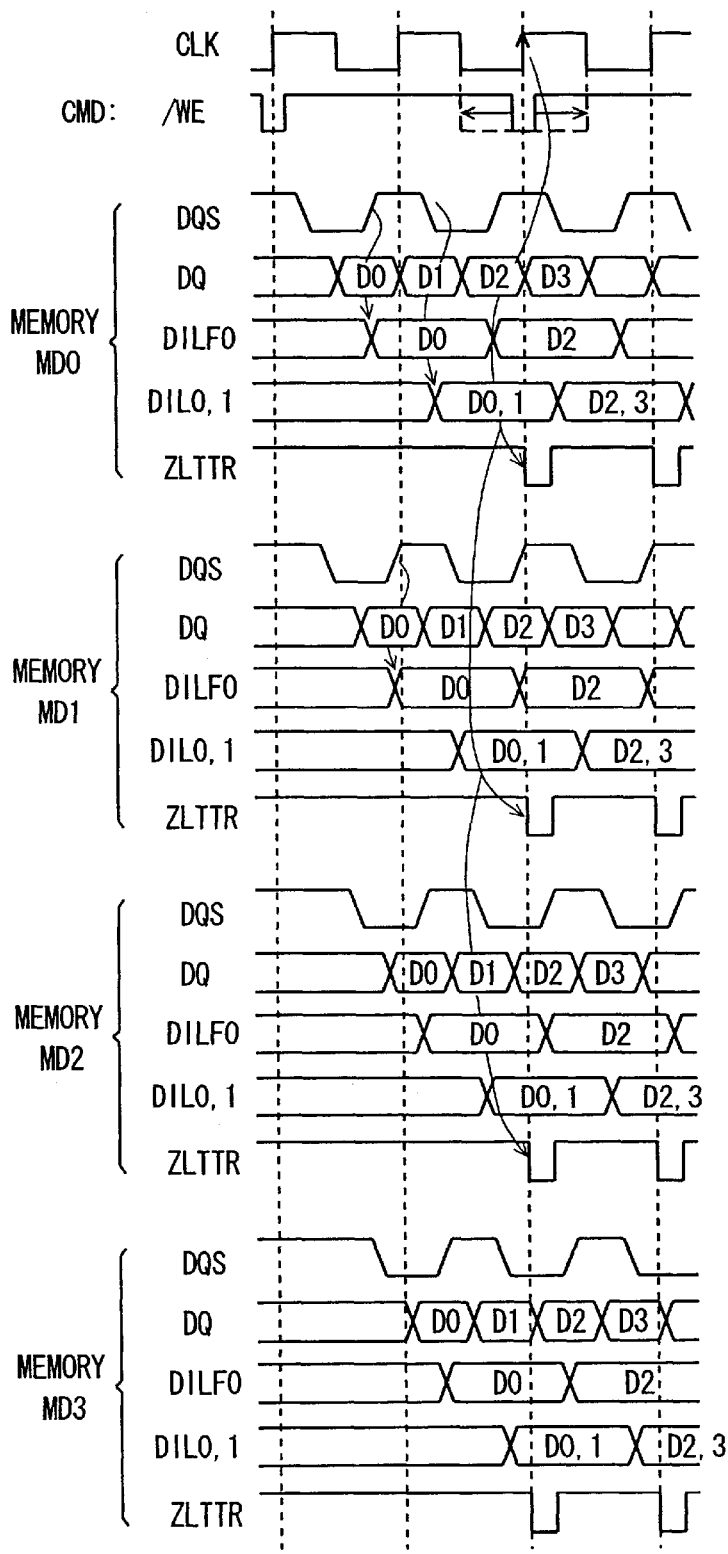
FIG. 29 is a timing chart representing an operation of the processing system shown in FIG. 28.
Figure 30:
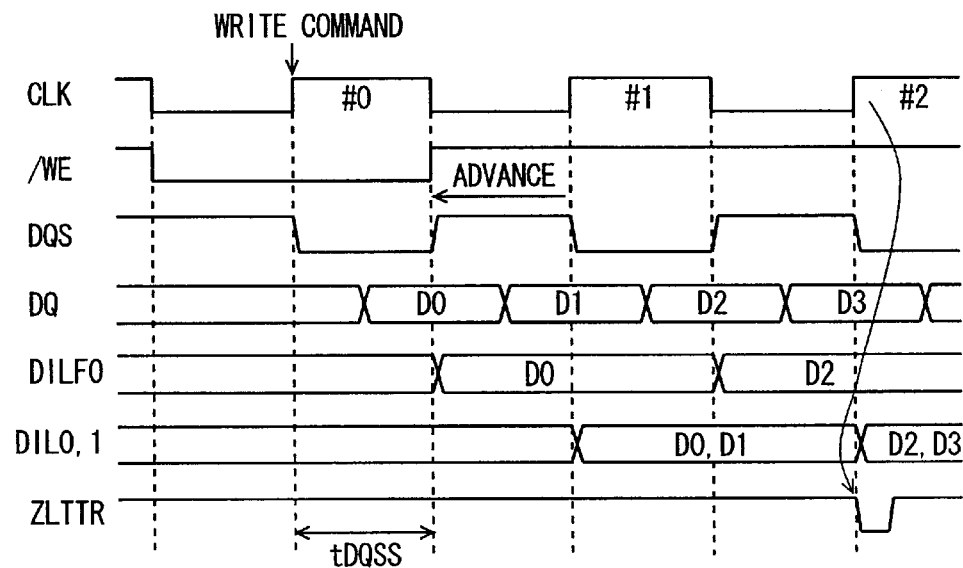
FIG. 30 is a timing chart related to the description of a problem of the flight time in the conventional semiconductor memory device.
Figure 31:
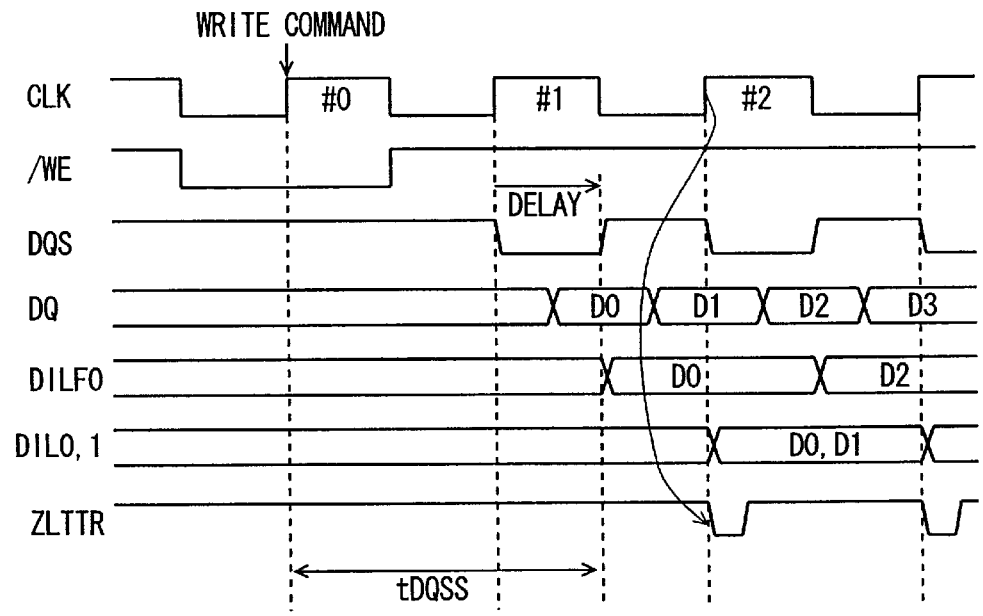
FIG. 31 is a timing chart related to the description of a problem of the conventional semiconductor memory device.
Figure 32:
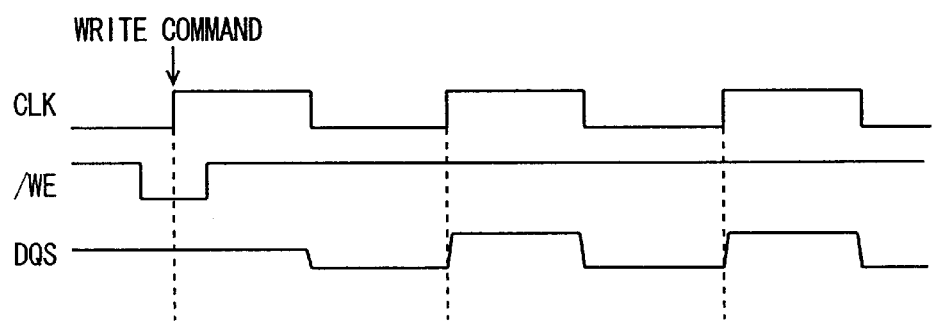
FIG. 32 is a schematic diagram representing a waveform of a data strobe signal in the conventional semiconductor memory device.

In the timing chart shown in FIG. 3, an activation period of a write command is indicated covering short periods before and after the rise period of clock signal CLK. The write command, however, is also affected by the flight time with respect to the memory so that the write command is made to be maintained in the active state for a sufficiently long period of time so as not to be affected by the flight time (see FIG. 29). Thus, by accurately controlling the internal latch/transfer state according to the flight time of data strobe signal DQS and the write data after the write command is supplied, the internal data can be accurately generated in synchronization with the internal clock signal.

Figure 4:
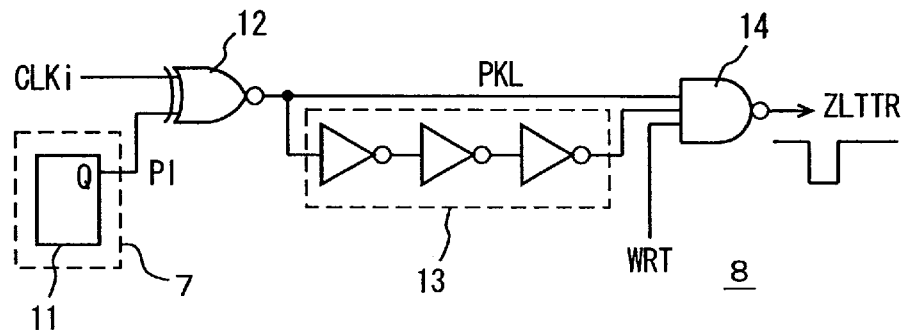
FIG. 4 is a diagram showing an example of an arrangement of an input control circuit shown in FIG. 1.

FIG. 4 is a diagram representing an arrangement of a latch transfer instructing signal generating portion and a position information generating circuit 7 included in input control circuit 8 shown in FIG. 1.

In FIG. 4, position information generating circuit 7 includes a register circuit 11 for storing position information PI. The register circuit may be one that has its holding data set externally or it may be one that has its holding data set internally. As a register circuit for storing data externally, a free register circuit in a mode register for storing operation parameters such as column latency and a burst length can be utilized.

The latch transfer instructing signal generating portion includes: an EXNOR circuit 12 receiving position information PI from register circuit 11 and an internal clock signal CLKi from a clock buffer 904; an inverting delay circuit 13 for delaying by a prescribed period of time and inverting an output signal of EXNOR circuit 12; and an NAND circuit 14 receiving an output signal PLK of EXNOR circuit 12, an output signal from inverting delay circuit 13, and a write activating signal WRT. Latch transfer instructing signal ZLTTR is generated from the NAND circuit 14.

EXNOR circuit 12 operates as a buffer circuit when position information PI is fixed at the H level, and operates as an inverter circuit when position information PI is set to the L level. Inverting delay circuit 13 and NAND circuit 14 function as a one-shot pulse generating circuit for generating a one-shot pulse signal in response to the rise of an output signal from EXNOR circuit 12 during the activation of write activating signal WRT. Thus; by setting position information PI to the H level or the L level, latch transfer instructing signal ZLTTR can be activated with either the rising edge or the falling edge of internal clock signal CLKi being a trigger.

Figure 5:
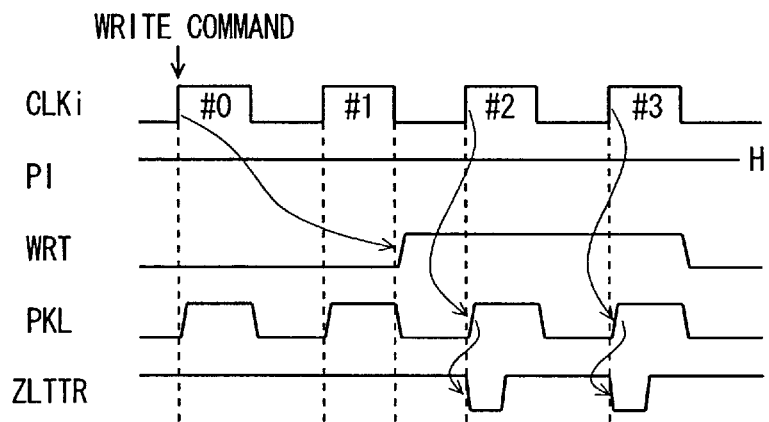
FIGS. 5 and 6 are timing charts representing an operation of the input control circuit shown in FIG. 4.

FIG. 5 is a timing chart showing an operation of the latch transfer instructing signal generating portion shown in FIG. 4. In FIG. 5, position information PI is set to the H level. When position information PI is set to the H level, EXNOR circuit 12 operates as a buffer circuit and generates output signal PKL according to internal clock signal CLKi.

When a write command is supplied in clock cycle #0, write activating signal WRT is activated after 1.5 cycles elapse. According to the activation of write activating signal WRT, NAND circuit 14 generates a one-shot pulse signal in response to the rise of output signal PKL of EXNOR circuit 12. Thus, upon the rise of internal clock signal CLKi in clock cycle #1, write activating signal WRT is at the L level, and latch transfer instructing signal ZLTTR maintains the H level. In clock cycle #2, when output signal PKL of EXNOR circuit 12 rises according to the rise of internal clock signal CLKi, NAND circuit 14 drives latch transfer instructing signal ZLTTR to the L level for a prescribed period of time. The period in which latch transfer instructing signal ZLTTR remains at the L level is determined by the delay time of inverting delay circuit 13. Since the burst length is four, write activating signal WRT maintains the H level for two clock cycle period. Thus, in clock cycle #3, when output signal PKL of EXNOR circuit 12 rises to the H level once again, latch transfer instructing signal ZLTTR is activated once again.

As shown in FIG. 3, in a memory remote from the controller, by setting position information PI at the H level, data latch and transfer can be performed from clock cycle #2 to generate the internal write data. Thus, the transfer of the first parallel data generated in clock cycle #2 to an internal circuit can be ensured.

By lengthening the delay time of NAND circuit 14 by a small amount, in clock cycles #2 and #3 as shown in FIG. 3, latch transfer instructing signal ZLTTR can be activated with a little delay to the rising edge of internal clock signal CLKi. Alternatively, as will be described later, a delay circuit may be further provided at the output of NAND circuit 14.

Figure 6:
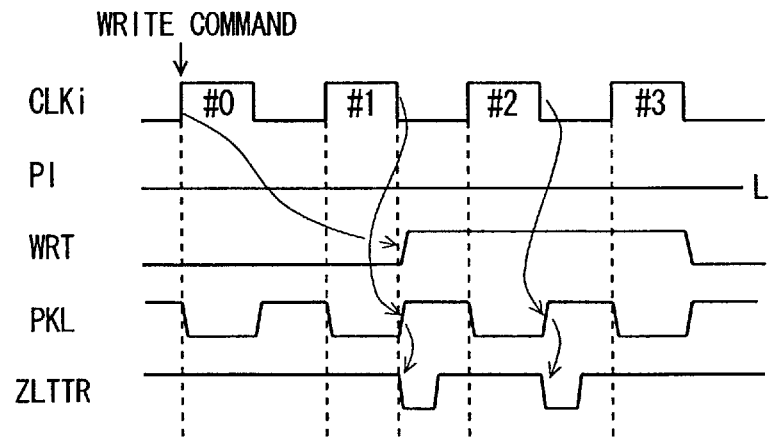

FIG. 6 is a timing chart representing an operation of the latch transfer instructing signal generating portion shown in FIG. 4 in the case when position information PI is set to the L level.

When position information PI is set to the L level, EXOR circuit 12 operates as an inverter circuit, and generates output signal PKL shifted in phase by 180° relative to internal clock signal CLKi.

When a write command is supplied in clock cycle #0, write activating signal WRT is activated in response to the fall of internal clock signal CLKi in clock cycle #1. This write activating signal WRT also has a burst length of four, and maintains the active state of the H level for two cycle period.

When write activating signal WRT attains the H level in clock cycle #1, NAND circuit 14 generates a one-shot pulse signal in response to the rise of signal PKL. Thus, in clock cycle #1, when internal clock signal CLKi falls to the L level and output signal PKL of EXNOR circuit 12 rises to the H level, latch transfer instructing signal ZLTTR is kept at the L level for a prescribed period of time.

Thereafter, in clock cycle #2, when internal clock signal CLKi attains the L level, latch transfer instructing signal ZLTTR is set to the L level for a prescribed period of time in response to the rise of the signal PKL.

Therefore, by setting position information PI at the L level, in a memory provided relatively close to the controller such as memories MD0 and MD1 as shown in FIG. 3, the latch and transfer of the internal data can be performed in response to the fall of internal clock signal CLKi to generate the write data in a cycle following the cycle in which the write command is supplied.

In addition, also in the timing chart shown in FIG. 6, with a gate delay or a delay circuit provided at an output portion of NAND circuit 14, the time point of activation of latch transfer instructing signal ZLTTR can be adjusted.

Figure 7:
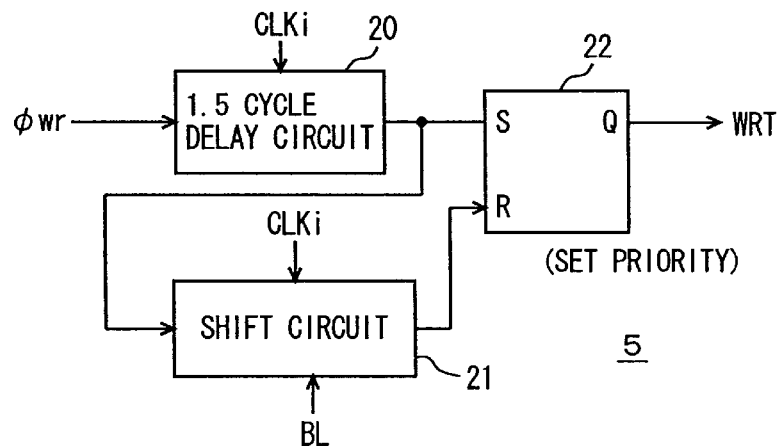
FIG. 7 is a diagram representing an example of an arrangement of a burst length counter shown in FIG. 1.

FIG. 7 is a diagram representing an example of an arrangement of a portion for generating write activating signal WRT. A write activating signal generating portion shown in FIG. 7 corresponds to burst length counter 5 shown in FIG. 1, Burst length data BL is set to the state indicating a burst length 4.

In FIG. 7, burst length counter 5 includes a 1.5 cycle delay circuit 20 for delaying a write operation mode instructing signal φWR from a main control circuit according to an internal clock signal CLKi, a shift circuit 21 for shifting an output signal from 1.5 cycle delay circuit 20 according to clock signal CLKi by a clock cycle period designated by burst length data BL, and a set priority-type set/reset flip-flop 22 that is set in response to the output signal from 1.5 cycle delay circuit 20 and reset in response to an output signal from shift circuit 21. Write activating signal WRT is generated from set priority-type set/reset flip-flop 22.

Shift circuit 21 is a variable shift circuit and its number of shift stages is adjusted according to burst length data BL. Now, the operation of burst length counter 5 shown in FIG. 7 will be described with reference to the timing chart shown in FIG. 8.

When a write command is supplied in clock cycle #0, write operation mode instructing signal φwr attains and is kept at the active state for a prescribed period of time in response to the rise of internal clock signal CLKi. The 1.5 cycle delay circuit 20 transfers this write instructing signal φwr by 1.5 cycles according to internal clock signal CLKi. Thus, in clock cycle #1, the output signal from delay circuit 20 attains the H level in response to the fall of internal clock signal CLKi, and flip-flop 20 is set, and write activating signal WRT is activated.

When the write command is supplied once again in clock cycle #2, write instructing signal φwr is activated and transferred via 1.5 cycle delay circuit 20.

In shift circuit 21, when burst length data BL indicates the burst length being 4, the output signal from shift circuit 21 attains the H level in response to the fall of internal clock signal CLKi in clock cycle #3.

At this time, the output signal from 1.5 cycle delay circuit 20 also attains the H level according to the write command supplied in clock cycle #2. Flip-flop 22 is a set priority-type set/reset flip-flop as described previously, and maintains its set state according to the output signal from delay circuit 20. Thus, when the write command is successively applied once every these two cycles, write activating signal WRT maintains its active state internally during that time.

Figure 8:
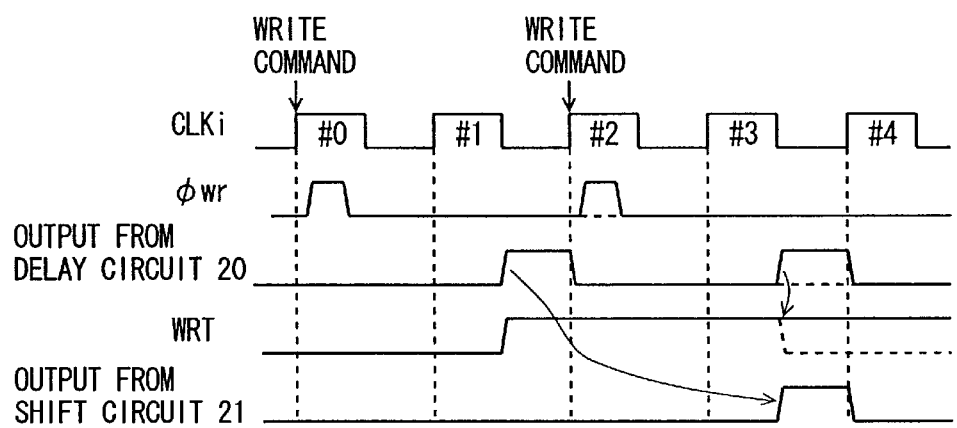
FIG. 8 is a timing chart representing an operation of the burst length counter shown in FIG. 7.

When a write command is not supplied in clock cycle #2, as shown by the broken line in FIG. 8, write instructing signal φwr is at the L level in clock cycle #2, and the output signal from delay circuit 20 maintains the L level in clock cycle #3 as shown by the broken line. Thus, in this case, flip-flop 22 is reset according to the output signal from shift circuit 21, and write activating signal WRT is rendered inactive in response to the fall of internal clock signal CLKi as shown by the broken line.

By utilizing burst length counter 5 shown in FIG. 7, write activating signal WRT can be maintained at the active state reliably for a burst length period according to burst length data BL, and internal transfer instructing signal ZLTTR can be activated at a prescribed timing.

In addition, in the arrangement of burst length counter 5 shown in FIG. 7, flip-flop 22 may be provided, at reset input R thereof, with a gate circuit that is enabled when the output signal from delay circuit 20 is at the L level for transmitting the output signal from shift circuit 21 onto reset input R. With such an arrangement, flip-flop 22 need not be a set priority-type flip-flop.

[First Arrangement of Position Information Generating Circuit]

Figure 9:
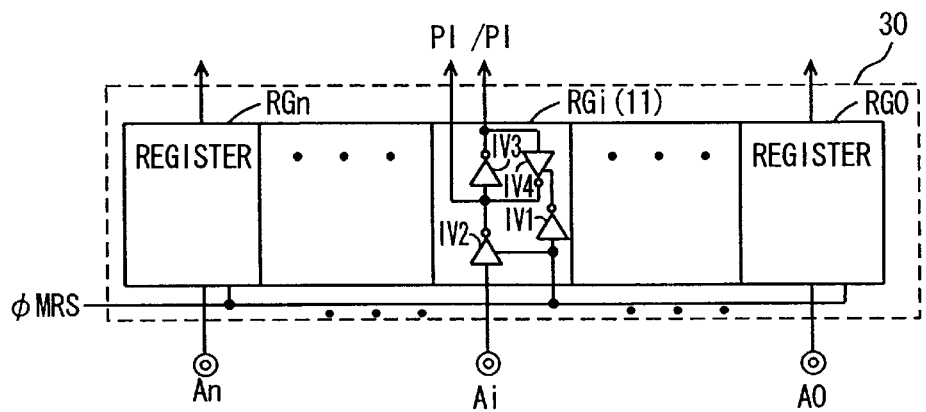
FIG. 9 is a diagram representing an example of an arrangement of a position information generating circuit shown in FIG. 1.

FIG. 9 is a diagram representing an example of an arrangement of a register circuit 11 of a position information generating circuit. In FIG. 9, a specific register RGi included in a mode register circuit 30 normally provided in a semiconductor memory device is utilized as a register for generating position information PI. In mode register circuit 30, register circuits RG0 to RGn are provided. When a mode register set command is supplied, these register circuits RG0 to RGn take in and latch address signal bits A0 to An supplied to the corresponding address terminals.

These register circuits RG0 to RGn have the same arrangement so that the arrangement of a register circuit RGi is shown representatively in FIG. 9. Register circuit RGi includes: an inverter IV1 for inverting a mode register setting instruction signal φMRS; a tristate inverter buffer IV2 that is activated during the activation of mode register setting instructing signal φMRS for transferring an address signal bit Ai of a corresponding address terminal; an inverter IV3 for inverting an output signal from tristate inverter buffer IV2; and a tristate inverter buffer IV4 that is activated in response to an inverted signal of mode register setting instructing signal φMRS from inverter IV1 and transferring an output signal from inverter IV3 to an input of inverter IV3 when activated. Position information PI is output from tristate inverter buffer IV2.

Mode register setting instructing signal φMRS is set to the H level for a prescribed period of time when a mode register set command is supplied. Tristate inverter buffer IV2 is rendered active when mode register setting instructing signal φMRS is at the H level, operates as an inverter, inverts address signal bit Ai of a corresponding address terminal, and transfers the inverted address signal bit to inverter IV3. Tristate inverter buffer IV2 is rendered inactive when mode register setting instructing signal φMRS is at the L level and attains the output high impedance state.

Tristate inverter buffer IV4 is activated when mode register setting instructing signal φMRS is at the L level, and forms a latch circuit with inverter IV3 when activated. Consequently, after the setting of data to mode register 30, register circuits RG0 to RGn attain the latched state. Tristate inverter buffer IV4 attains the output high impedance state when mode register setting instructing signal φMRS is at the H level, and register circuit RGi attains a through state where applied data is transferred and outputted.

Thus, by supplying the mode register set command to activate mode register setting instructing signal φMRS for setting a corresponding address signal bit Ai to the H level or the L level, the stored data of register circuit RGi can be set, and position information PI can be generated according this stored data.

In mode register circuit 30, a register circuit for storing burst length data BL and a register circuit for storing column latency CL may be provided. In addition, the burst length data BL and column latency CL may be stored in a mode register circuit provided separately for another application. When a plurality of individual mode register circuits for different applications are provided, the mode register circuit is specified by a bank address signal bit BA or the like.

Instead of the above-described inverter latch arrangement, mode register circuit 30 may be configured such that these register circuits RG0 to RGn are formed by a set/reset flip-flop which is set when a corresponding address signal bit is at the H level. With such an arrangement, in the default state of these register circuits, the flip-flop is in the reset state.

In addition, one register circuit in these register circuits RG0 to RGn may have its storage data set according to the data supplied to a specific data input terminal in a mode register set mode.

Figure 10:
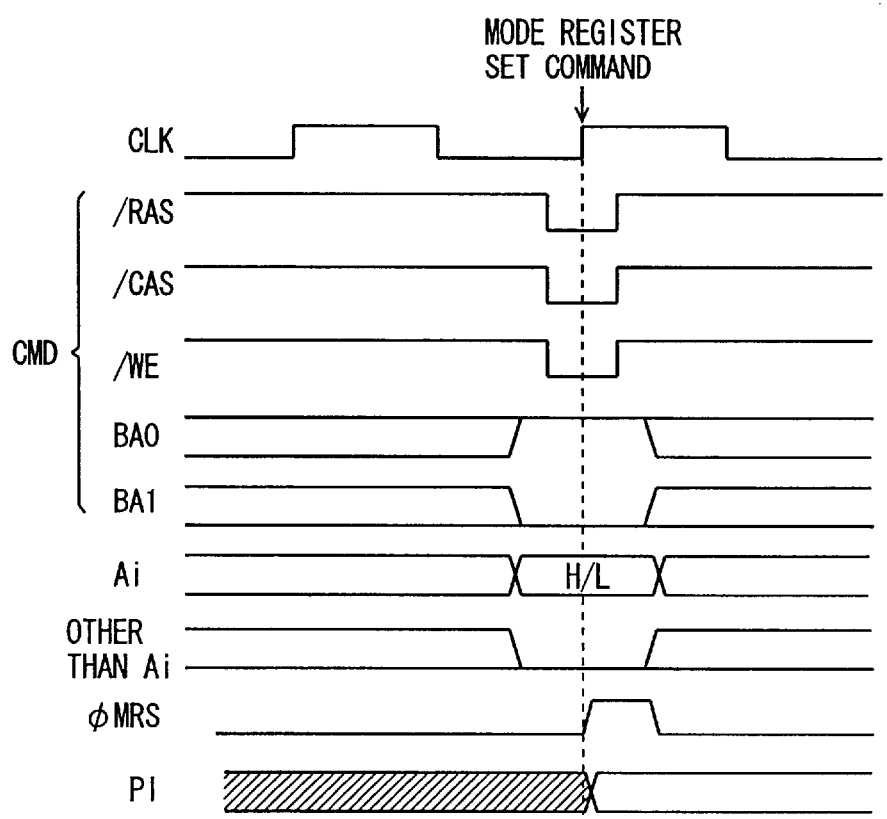
FIG. 10 is a diagram representing an operation timing for setting the position information to the position information generating circuit shown in FIG. 9.

FIG. 10 is a timing chart representing an operation of setting the position information in the case where mode register circuit 30 is utilized. The operation of setting the position information in mode register circuit 30 shown in FIG. 9 will be described below with reference to FIG. 10. A command CMD designating a mode register set command is applied by setting a row address strobe signal /RAS, a column address strobe signal /CAS, and a write enable signal /WE to the L level at the rising edge of a clock signal CLK, and by setting a bank address signal bit BA0 to the H level and a bank address signal bit BA1 to the L level. At this time, address signal bit Ai is set to the H level or the L level according to the position information, and the remaining address signal bits (other than Ai) are set to the L level.

Normally, when bank address signal bit BA0 is to set to the H level, an extended mode register set (MRS) mode is designated, a different mode register circuit from the mode register circuit for setting column latency CL and burst length data BL is designated, and the setting of column latency CL and burst length BL is not performed. To set column latency CL and burst length BL, bank address signal bit BA0 is set to the L level. The setting of position information PI, however, can be performed in parallel to the setting of column latency CL and burst length BL. In this case, the corresponding address signal bits to the column latency register and the burst length register are set to the logic levels corresponding to the values of column latency CL and burst length BL in addition to the setting of the position information.

Moreover, the setting of remaining address signal bits to the L level is merely one example. The remaining address signal bits may be set to appropriate logic levels according to other operation parameters set at the same time, as long as the stored data in other register circuits are not unnecessarily changed.

In response to the rise of clock signal CLK, mode register setting instructing signal φMRS attains the H level, and tristate inverter buffer IV2 shown in FIG. 9 is activated. At this time, position information PI is set in a register circuit RGi in accordance with the H level or the L level of address signal bit Ai.

For the remaining registers RGn to RG (i+1) and RG (I−1) to RG0 in mode register circuit 30, the address signal bits are at the L level, and the data corresponding to the L level are set. Upon setting of position information PI, other operation parameters may also be set.

Upon system reset or power-on, column latency CL and burst length BL are set under the control of the controller. At this time, position information PI may also be set at the same time.

Figure 11:
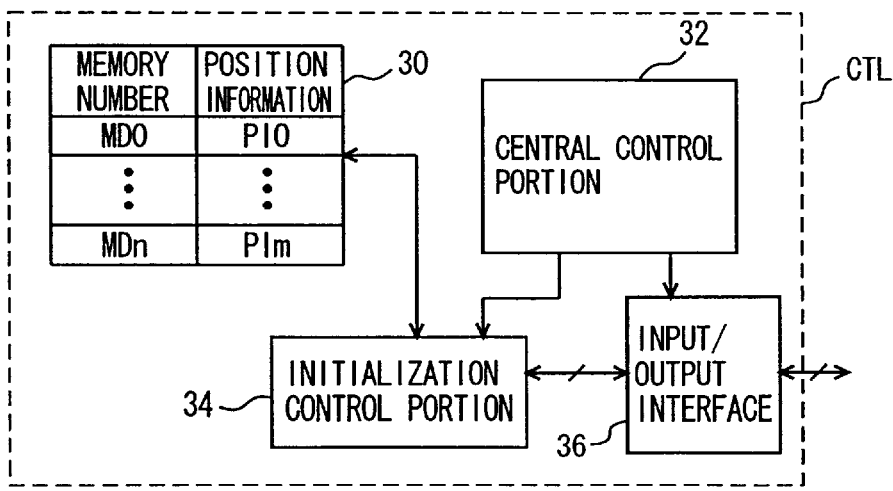
FIG. 11 is a schematic diagram representing an arrangement of a main portion of a controller.

FIG. 11 is a schematic diagram representing an arrangement of a portion related to the setting of position information PI in a controller CTL. In FIG. 11, controller CTL includes a position information table 30 for storing the position information of the respective memories, a central control portion 32 for controlling access and others to a memory within the processing system, an initialization control portion 34 for transferring the position information to each memory according to the initialization instruction from central control portion 32 and according to the position information stored in position information table 30, and an input/output interface 36 that serves as an interface among the memories and initialization control portion 34 and central control portion 32.

Position information table 30 stores corresponding memory numbers and position information PI0 to PIn corresponding to the respective memories MD0 to MDn in the form of a table. Initialization control portion 34 refers to the memory number and the corresponding position information stored in position information table 30 and sets position information PI for each memory according to an initializing sequence execution instruction from central control portion 32.

When setting the position information for the respective memories, the chip enable signals /CEi is successively activated for each memory, thereby causing memories MD0 to MDm to enter the select state successively, and a mode register set command is supplied for storing position information PI. As to command CMD, it is determined in the memory that a valid command is supplied when the chip enable signal /CEi is in the active state, and the decoding of the command is performed. In other words, when the chip enable signal is inactive, command CMD is handled as a NOP command.

Figure 12:
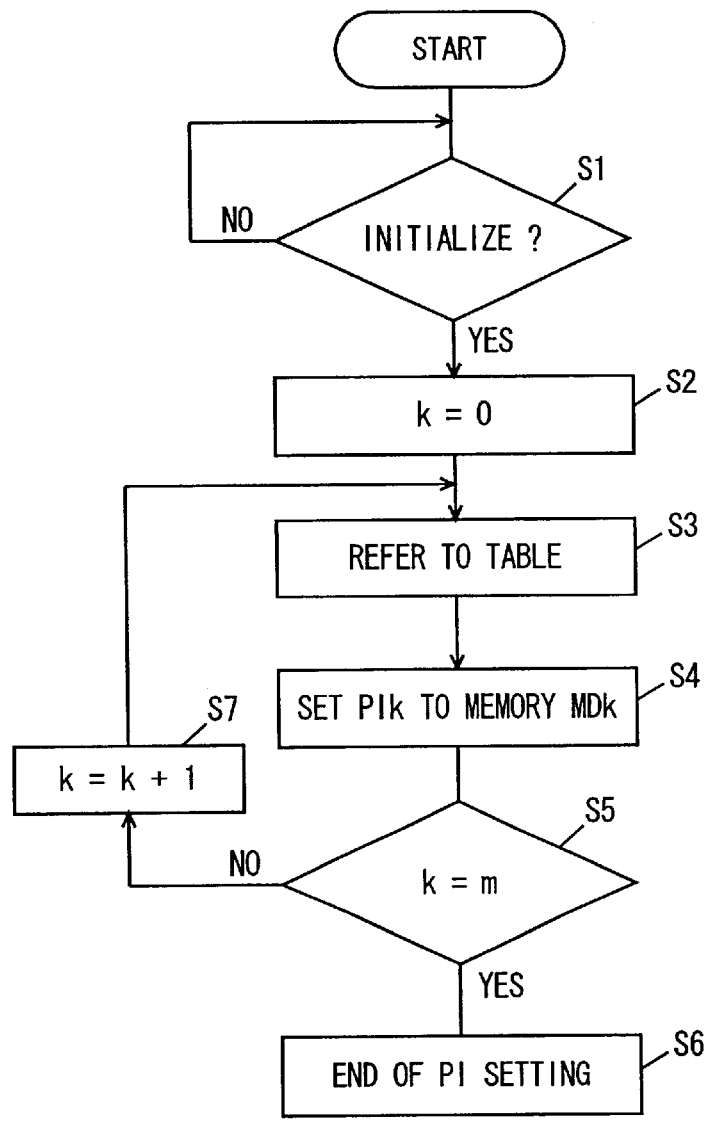
FIG. 12 is a diagram representing an operation flow of an initializing sequence of the controller shown in FIG. 11.

FIG. 12 is a flow chart representing an operation in the setting of the position information of controller CTL. The operation of setting the position information of controller CTL shown in FIG. 11 will be described below with reference to FIG. 12.

First, central control portion 32 determines whether there is a need to perform initialization (step S1). The execution of the initializing sequence is required upon power-on or upon system reset. When central control portion 32 determines that there is a need to perform the initializing sequence, central control portion 32 starts initialization, control portion 34. Initialization control portion 34 first sets a memory number k that specifies a memory to an initial value "0" (step S2). Thereafter, position information table 30 is retrieved according to memory number k, and position information PI0 of memory MD0 designated by the memory number k is read (step S3). Then, via input/output interface 36, a mode register set command is supplied to memory MD0, and position information PI0 is sent out at the same time (step S4).

When setting the position information, a chip enable signal /CE is activated for memory MD0 specified by the memory number k, while chip enable signals /CE for the remaining memories MD1 to MDm are maintained in the inactive state.

When setting the position information for the memory, instead of the activation of chip enable signal /CEi, an address signal for specifying a memory as well as chip enable signal /CE may be provided in common to the memories. In this case, the chip enable signal /CE and a memory address that specifies a memory are supplied in common to memories MD0 to MDm. In the memory designated by the memory address, the setting of the position information for a specific register (RGi) of the mode register is performed according to the activation of chip enable signal /CE. In this case, however, there is a need to provide, in each memory, a decoder for decoding a memory specifying address signal.

When position information PI0 is set to memory MD0, it is then determined whether the memory number k designates the final memory MDm (step S5). Upon the initial position information setting operation, the memory number k is 0 so that the processing moves to step S7 for incrementing the memory number by one, and returns to step S3 (step S7). Thereafter, the operations from step S3 to step S5 and of step S7 are repeatedly executed until the position information for the final memory is set.

In step S5, when it is determined that the position information for the final memory is set, the setting of position information PI for memories MD0 to MDm ends (step S6). Thereafter, another processing will be waited for.

In information table 30 shown in FIG. 11, when assembling the system, upon the program initialization to the controller, the position information is also stored. Alternatively, the memories and the position information may be programmed in a table form in an ROM (Read Only Memory) in advance. In this case, when the system is assembled, the position information and the memory number for each memory are always uniquely determined according to the position relative to the controller (for instance, according to the position of a memory mounting socket).

Figure 13:
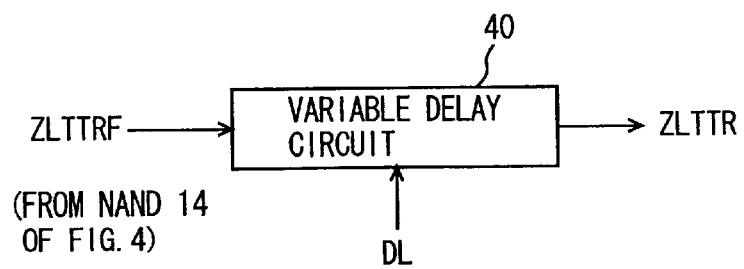
FIG. 13 is a diagram representing a modification of the input control circuit shown in FIG. 4.

Moreover, when setting position information PI using the controller, an amount of delay of latch transfer instructing signal ZLTTR relative to an edge of a clock signal may similarly be set at the same time according to the delay amount setting data stored in a specific register circuit. Specifically, as shown in FIG. 13, a variable delay circuit 40 receives an output signal ZLTTRF from NAND circuit 14 shown in FIG. 4 to generate latch transfer instructing signal ZLTTR. The amount of delay of variable delay circuit 40 is adjusted according to delay amount setting data DL from a register circuit, not shown.

By utilizing variable delay circuit 40 shown in FIG. 13, the activation timing of latch transfer instructing signal ZLTTR can be delayed from the rising edge and the falling edge of the internal clock signal, and as in the timing chart shown in FIG. 3, sufficient set up time and hold time can be ensured with respect to latch data DIL0 and DIL1 to generate the internal write data with stability.

[Second Arrangement of Position Information Generating Circuit]

Figure 14:
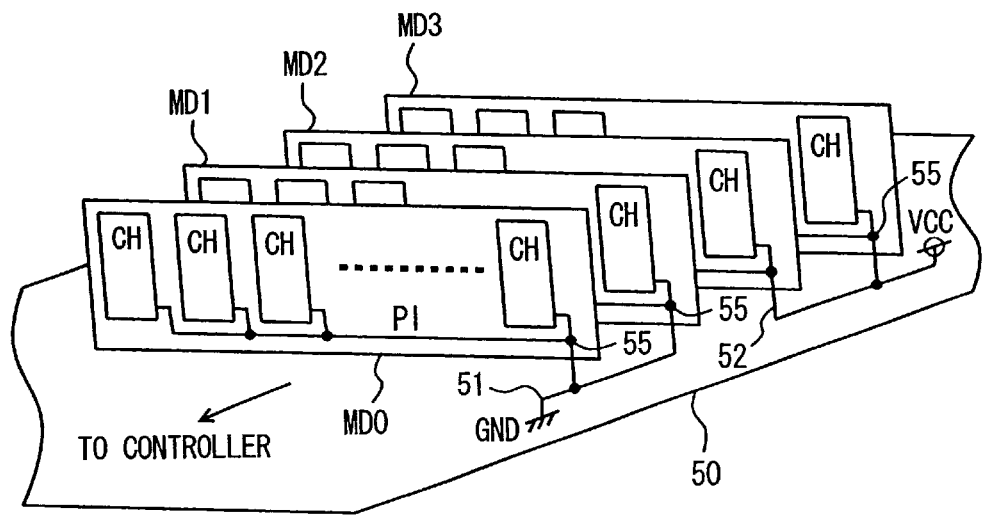
FIG. 14 is a schematic diagram representing another arrangement of the position information generating circuit shown in FIG. 1.

FIG. 14 is a schematic diagram representing a second arrangement of the position information generating circuit. In FIG. 14, memories MD0 to MD3 are arranged on a mother board 50. Memories MD0 to MD3 are memory modules and include a plurality of memory chips CH. Each of memory chips CH has the arrangement shown in FIG. 1.

Memories MD0 to MD3 are arranged such that their respective distances relative to the controller become longer in this order, i.e., longest at memory MD3.

Position information setting terminals 55 of memories MD0 and MD1 are connected to an on-board ground line 51. Position information setting terminals 55 of memories MD2 and MD3 are connected to an onboard power supply line 52. Thus, for memories MD0 and MD1, position information PI is set to the L level in a fixed manner, while for memories MD2 and MD3, position information PI is set to the H level in a fixed manner.

Therefore, in the case of the arrangement shown in FIG. 14, the controller is not particularly required to set the position information with respect to each of memories MD0 to MD3. The position information setting terminal of a module mounting socket (not shown) arranged on mother board 50 is connected in a fixed manner to a ground line or a power supply line according to the distance on the basis of the controller. Consequently, in memory chip CH, position information PI is supplied via a specific terminal, and after the power-on, fixed position information PI is generated at all times. Therefore, the controller is not required to perform the initializing sequence to set the position information upon system reset or upon power-on so that the processing of the position information setting is simplified.

In addition, as shown in FIG. 14, when a position information setting terminal is connected to ground line 51 or power supply line 52 upon assembling on mother board 50, a register circuit for holding the position information is not particularly required, and therefore, the area occupied by the position information generating portion can be saved within the memory chip.

[Third Arrangement of Position Information Generating Circuit]

Figure 15:
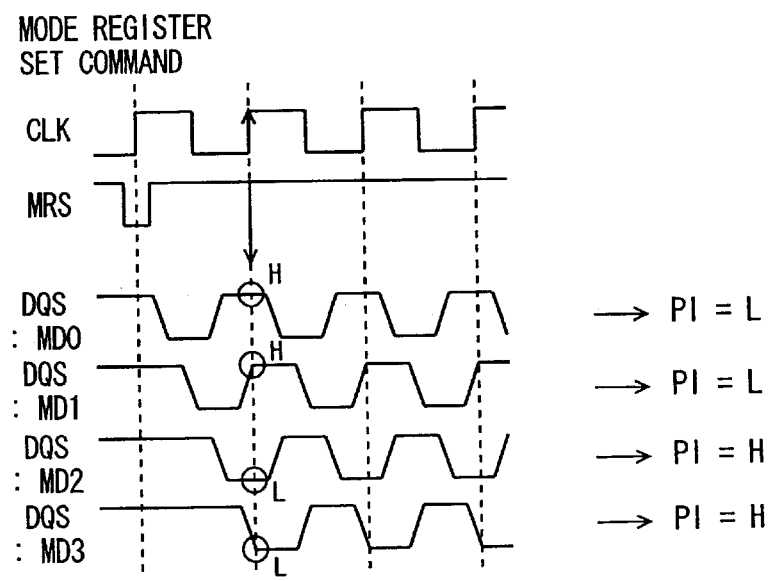
FIG. 15 is a timing chart representing an operation of another arrangement of the position information generating circuit shown in FIG. 1.

FIG. 15 is a timing chart representing an operation of the third arrangement of the position information generating circuit. In the operation of setting the position information shown in FIG. 15, for instance, a mode register set command MRS is supplied, and then, a logic level of a specific signal is determined upon the subsequent rise of clock signal CLK, and position information PI is generated. In FIG. 15, a data strobe signal DQS is employed as such specific signal.

Referring to the waveform diagram shown in FIG. 15, for memories MD0 and MD1, data strobe signal DQS is at the H level at the rising edge of clock signal CLK, and position information PI is set to the L level. On the other hand, in memories MD2 and MD3, data strobe signal DQS is at the L level at the rising edge of clock signal CLK so that position information PI is set to the H level.

The flight time of a signal/data is only delayed as much as about one cycle period of clock signal CLK. When data strobe signal DQS is further delayed and attains the H level at the rising edge of clock signal CLK, the flight time of the signal/data becomes equal to one clock cycle period of clock signal CLK or longer, and the accurate data latch transfer cannot be guaranteed. Thus, such a state would not be considered. Therefore, accurate data transfer is guaranteed, for instance, in the case where data strobe signal DQS is shifted in phase by about ±50% with respect to clock signal CLK.

Figure 16:
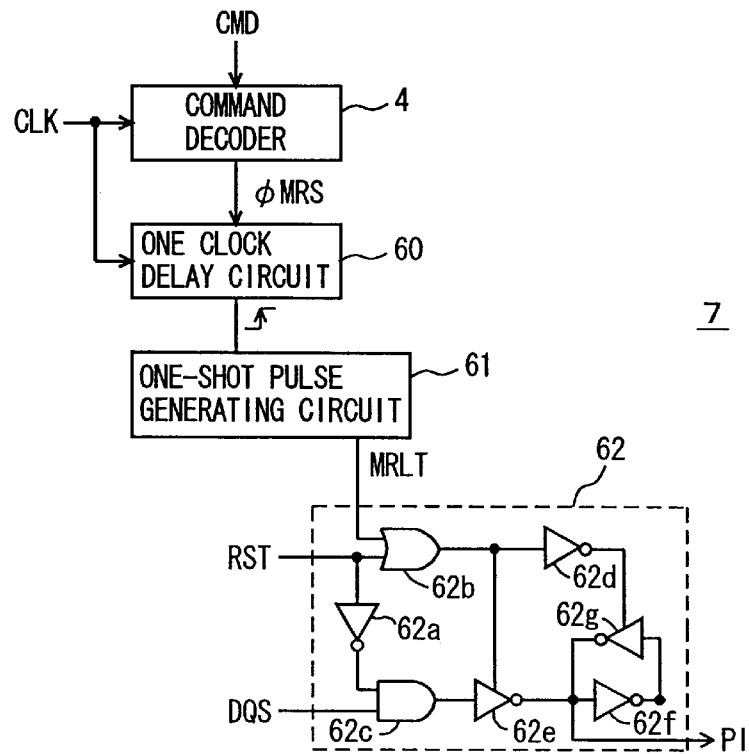
FIG. 16 is a diagram representing an example of an arrangement of a position information generating circuit realizing an operation shown in FIG. 15.

FIG. 16 is a diagram representing an example of an arrangement of a position information generating circuit having a position information detecting function shown in FIG. 15. In FIG. 16, a position information generating circuit 7 includes a one clock delay circuit 60 for delaying a mode register setting instruction signal φMRS from a command decoder 4 by one clock cycle period of a clock signal CLK, a one-shot pulse generating circuit 61 for generating a one-shot pulse signal in response to the rise of an output signal from one clock delay circuit 60, and a latch circuit 62 for taking in data strobe signal DQS and generating position information PI in response to an output signal MRLT from one-shot pulse generating circuit 61.

One-shot pulse generating circuit 61 generates one-shot pulse signal MRLT in response to the rise of the output signal from one clock delay circuit 60. Thus, one-shot pulse signal MRLT is activated when one clock cycle elapses since a mode register set command is supplied.

Latch circuit 62 includes: an inverter 62a for inverting a reset signal RST; an OR circuit 62b receiving one-shot pulse signal MRLT and reset signal RST; an AND circuit 62c receiving an output signal from inverter 62a and a data strobe signal DQS; a tristate inverter buffer 62e that is activated when an output signal from OR circuit 62b is at the H level for inverting an output signal from AND circuit 62c; an inverter 62f for inverting an output signal from tristate inverter buffer 62e; an inverter 62d for inverting the output signal from OR circuit 62b; and a tristate inverter buffer 62g that is activated when an output signal from inverter 62d is at the H level for transferring an output signal from inverter 62f to an input of inverter 62f. The position information is output at an output of inverter 62g.

Reset signal RST is activated upon system reset or upon power-on. Now, an operation of the position information generating circuit shown in FIG. 16 will be described with reference to the timing chart shown in FIG. 17.

When setting the position information, a prescribed initialization operation of an internal circuit node is already complete, and position information PI is initialized to the H level by reset signal RST. After the completion of the reset operation, reset signal RST is at the L level. Until one-shot pulse signal MRLT output from one-shot pulse generating circuit 61 is generated, the output signal of OR circuit 62b is at the L level, and since tristate inverter buffer 62e is in the output high impedance state, the transmission of data strobe signal DQS is inhibited, and the H of the position information is held by a latch circuit formed by tristate inverter buffer 62g and inverter 62f.

When a mode register set command is supplied, command decoder 4 holds mode register setting instructing signal φMRS in the active state for a prescribed period of time. This mode register setting instructing signal φMRS is delayed by one clock cycle period by one clock delay circuit 60 and then output. In a clock cycle in which the mode register set command is supplied, one-shot pulse signal MRLT is not generated so that, in latch circuit 62, the output signal of OR circuit 62b is at the L level and tristate inverter buffer 62e is in the output high impedance state. Therefore, even when the output signal from AND circuit 62c changes according to data strobe signal DQS, an output signal PI from latch circuit 62 does not change.

When one clock cycle elapses from the supply of the mode register set command, one-shot pulse generating circuit 61 generates one-shot pulse signal MRLT according to an output signal from one clock delay circuit 60. According to one-shot pulse signal MRLT, tristate inverter buffer 62g is rendered inactive and attains the output high impedance state in latch circuit 62, and the latched state of latch circuit 62 is released.

In addition, according to this one-shot pulse signal MRLT, the output signal of OR circuit 62b attains the H level, and tristate inverter buffer 62e is activated, and position information PI changes according to the output signal of AND circuit 62c. Thus, data strobe signal DQS at the rise of clock signal CLK is taken in via AND circuit 62c and tristate inverter buffer 62e, and position information PI is set.

When one-shot pulse signal MRLT returns to the L level, the output signal from OR circuit 62b attains the L level, and tristate inverter buffer 62e attains the output high impedance state. On the other hand, tristate inverter 62g is activated, a latch circuit is formed by inverter 62f and tristate inverter buffer 62g, and position information PI, taken in, is latched.

Specifically, at the rising edge of clock signal CLK, if data strobe signal DQS is at the H level, position information PI attains the L level. On the other hand, at the rising edge of clock signal CLK, if data strobe signal DQS is at the L level, position information PI maintains the H level.

Figure 17:
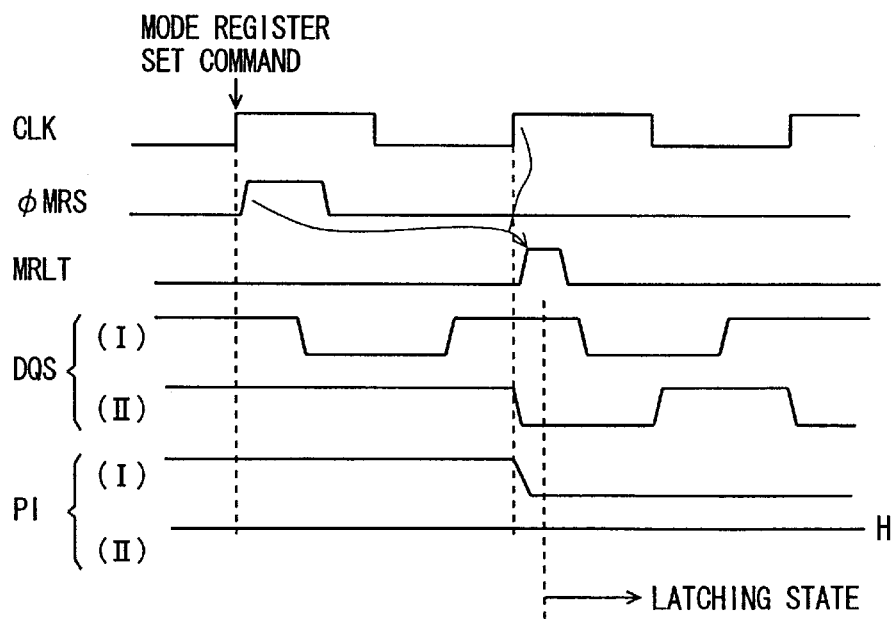
FIG. 17 is a timing chart representing an operation of the position information generating circuit shown in FIG. 16.

Thus, as shown in FIG. 17, when the delay time of data strobe signal DQS is short (DQS state (I)), position information PI is set to the L level (PI state (I)), and when the delay time of data strobe signal DQS is long (DQS state (II)), position information PI maintains the H level of the reset state (PI state (II)).

By setting the position information according to the delay time in each of the memories, the position information can be set in each memory with accuracy even when the system configuration is changed and the signal propagation delay is changed.

In addition, in the case where latch circuit 62 is a mode register included in a mode register circuit, an arrangement may be employed, in which a mode register set command CMD is supplied as a command, together with an address signal bit Ai specifying this mode register and a mode register setting instructing signal $\phi$MRS is activated when address signal bit Ai is at the H level. In this case, mode register setting instructing signal $\phi$MRS is activated only in the mode for setting the position information so that the position information can be taken in and latched with accuracy without affecting the storage data in other register circuits.

As described above, in the third arrangement of the position information generating circuit, the position information is generated in a specific operating mode by using a data strobe signal as a specific timing detecting signal and by determining the logic level of data strobe signal DQS at the rising edge of a clock signal. Thus, the position information can be generated for each of the memories according to the signal propagation delay of each memory, and the load for the controller is alleviated.

In addition, the position information can be set in each memory with accuracy even when the load on the system bus changes, and the flight time of a signal/data with respect to each memory changes. Moreover, the position information can be generated with accuracy in each memory even when the number of memories is changed upon system extension.

In the above description, a data strobe signal DQS is utilized in order to generate the position information. Instead of data strobe signal DQS, however, for instance, a specific data bit may be employed, and any signal may be employed as long as it exhibits a great influence by the flight time.

[Fourth Arrangement of Position Information Generating Circuit]

Figure 18:
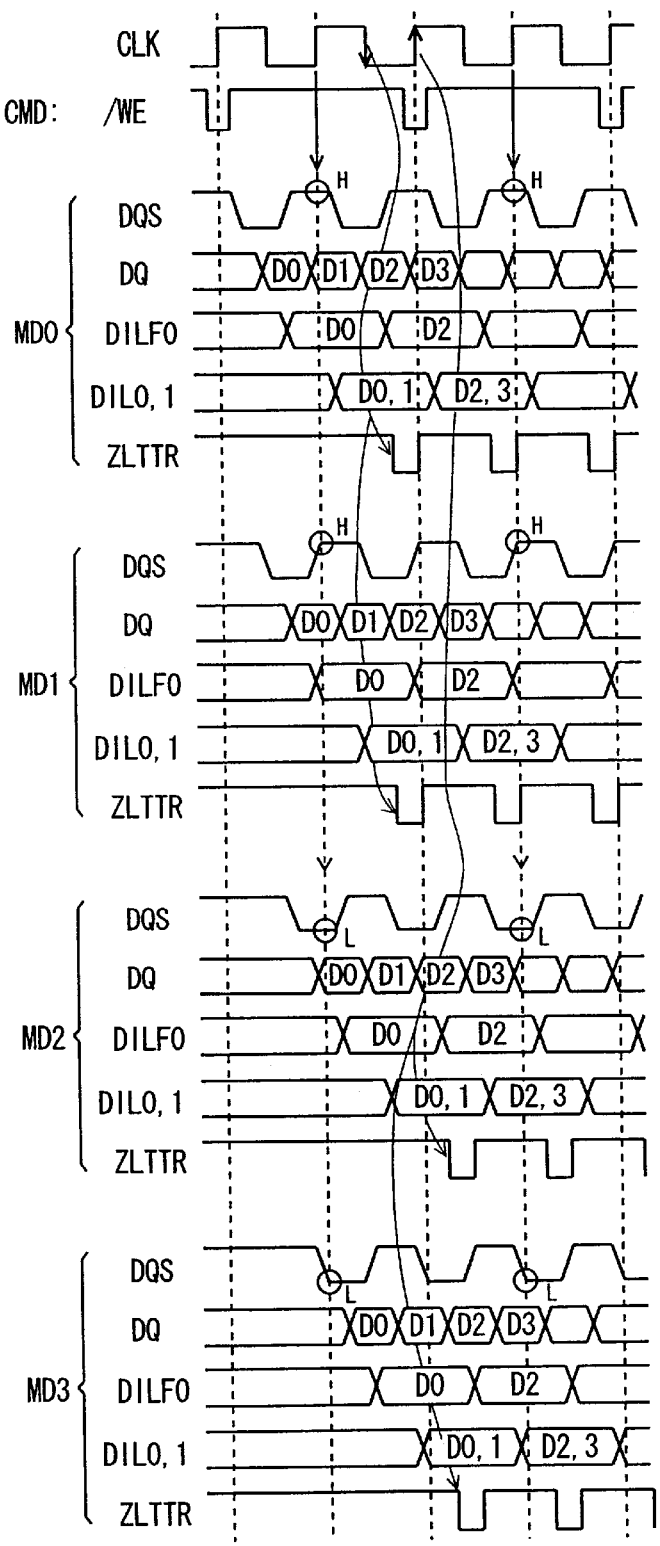
FIG. 18 is a timing chart representing an operation of a further arrangement of the position information generating circuit shown in FIG. 1.

FIG. 18 is a timing chart representing an operation of memories according to the fourth arrangement of position information generating circuit 7. FIG. 18 shows a position information generating operation in memories MD0 to MD3. These memories MD0 to MD3 are arranged in this order relative to the controller, with memory MD0 closest to the controller.

When a write command instructing a data write operation (indicated by the L level of signal /WE) is supplied, in a subsequent clock cycle, the logic level of data strobe signal DQS is identified, and the position information is generated according to this identified logic level. According to this generated position information, a latch transfer instructing signal ZLTTR is generated. Therefore, in memories MD0 and MD1 in a data write operation, data strobe signal DQS is at the H level at the rising edge of a clock signal CLK in the subsequent clock cycle after the write command is supplied, and latch transfer instructing signal ZLTTR is generated in response to the fall of clock signal CLK in that clock cycle.

On the other hand, in memories MD2 and MD3, since their respective distances from the controller are greater, data strobe signal DQS is at the L level at the rising edge of clock signal CLK in the subsequent clock cycle after the write command is supplied. Thus, latch transfer instructing signal ZLTTR is generated in synchronization with the rising edge of clock signal CLK in the succeeding clock cycle.

As shown in FIG. 18, in the data write operation, by regularly identifying the logic level of the data strobe signal to generate the position information, the generation of internal write data can be performed with accuracy even when the flight time of a signal/data changes due to the variation in the system load.

Figure 19:
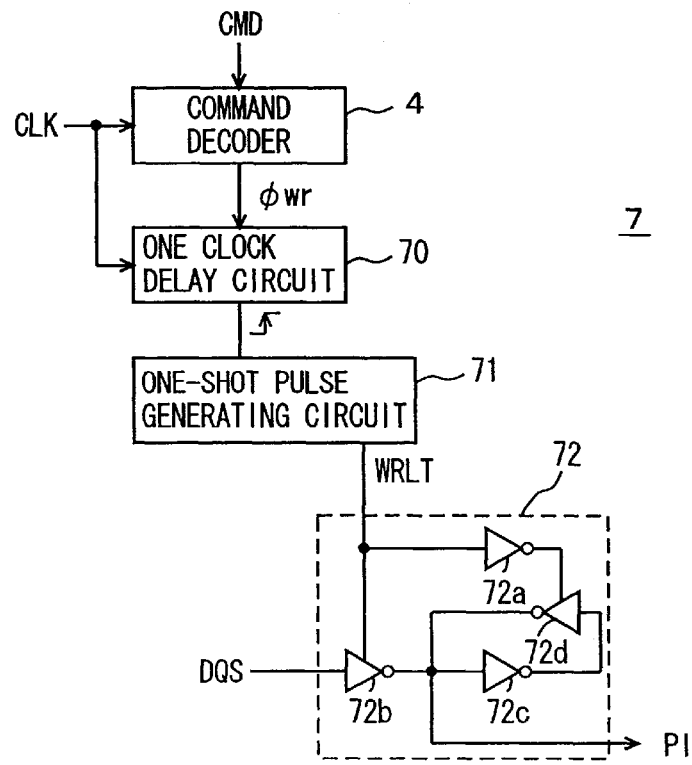
FIG. 19 is a diagram representing an example of an arrangement of a position information generating circuit implementing the operation timing shown in FIG. 18.

FIG. 19 is a diagram representing an example of an arrangement of the fourth modification of position information generating circuit 7. In FIG. 19, position information generating circuit 7 includes a one clock delay circuit 70 for delaying a write operation mode instructing signal $\phi$wr from a command decoder 4 by one clock cycle of a clock signal CLK, a one-shot pulse generating circuit 71 for generating a one-shot pulse signal in response to the rise of an output signal from one clock delay circuit 70, and a latch circuit 72 for taking in and latching a data strobe signal in response to a one-shot pulse signal WRLT from one-shot pulse generating circuit 71.

When a command CMD is a write command instructing a data write operation (the state in which a write enable signal /WE is at the L level is shown representatively in FIG. 18), command decoder 4 activates write operation mode instructing signal $\phi$wr in response to the rise of clock signal CLK.

One clock delay circuit 70 delays this write operation mode instructing signal $\phi$wr by one clock cycle. Thus, in response to the rise of clock signal CLK in the subsequent clock cycle after the write command is supplied, the output signal from one clock delay circuit 70 rises to the H level.

Since one-shot pulse generating circuit 71 generates a one-shot pulse in response to the rise of the output signal from one clock delay circuit 70, one-shot pulse signal WRLT from one-shot pulse generating circuit 71 is generated in the subsequent clock cycle after the write command is supplied.

Latch circuit 72 includes an inverter 72a for inverting one-shot pulse signal WRLT from one-shot pulse generating circuit 71, a tristate inverter buffer 72b that is activated in response to this one-shot pulse signal WRLT for inverting data strobe signal DQS and outputting the inverted signal when activated, an inverter 72c for inverting an output signal from tristate inverter buffer 72b, and a tristate inverter buffer 72d that is activated when an output signal from inverter 72a is at the H level for inverting an output signal from inverter 72c and transferring the inverted signal to an input of inverter 72c when activated.

Position information PI is generated at the input of inverter 72c, and this position information PI is driven by tristate inverter buffer 72d during a normal operation.

Figure 20:
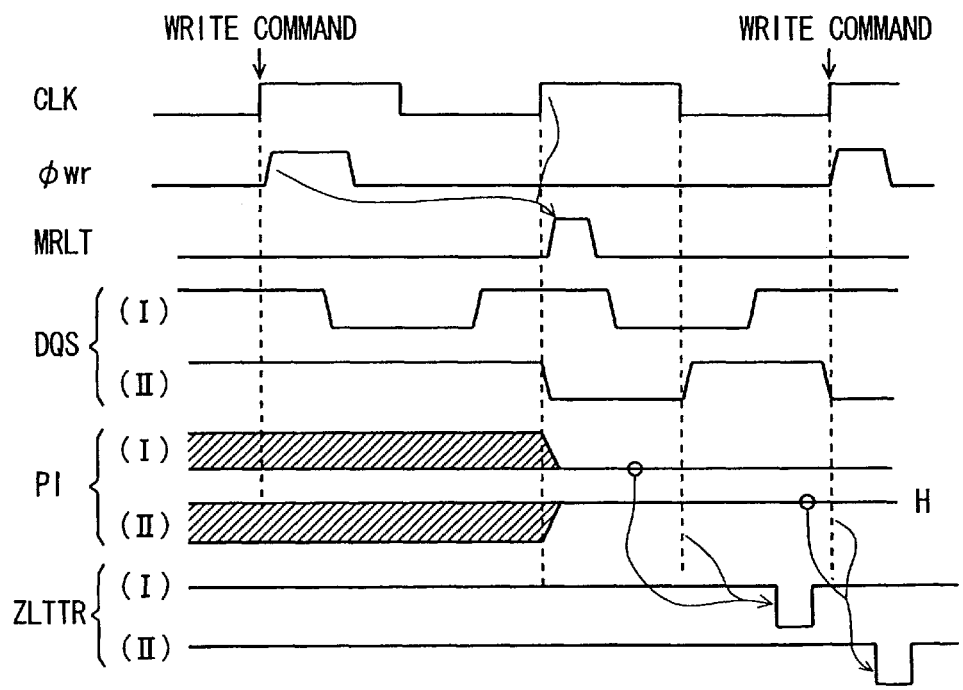
FIG. 20 is a timing chart representing an operation of the position information generating circuit shown in FIG. 19.

Tristate inverter buffers 72b and 72d are in the output high impedance state when inactive. A latch circuit is formed by inverter 72c and tristate inverter buffer 72d in the active state. Now, an operation of position information generating circuit 7 shown in FIG. 19 will be described with reference to the timing chart shown in FIG. 20.

When a write command is supplied, write operation mode instructing signal φwr is activated in synchronization with the rise of clock signal CLK, and one clock delay circuit 70 delays write operation mode instructing signal φwr by one clock cycle period. Consequently, one-shot pulse signal WRLT from one-shot pulse generating circuit 72 is activated in response to the rise of clock signal CLK in the next clock cycle.

According to the generation of one-shot pulse signal WRLT, tristate inverter buffer 72b in latch circuit 72 is activated, inverts data strobe signal DQS, and transfers the inverted signal. Thus, data strobe signal DQS is taken into latch circuit 72, and the state of position information PI is determined according to data strobe signal DQS, taken in.

When one-shot pulse signal WRLT attains the L level, tristate inverter buffer 72b is rendered inactive, and attains the output high impedance state, whereas tristate inverter buffer 72d is rendered active and operates as an inverter, and latch circuit 72 attains the latching state.

Position information PI is an inverted signal of this data strobe signal DQS taken in. When position information PI is at the L level, latch transfer instructing signal ZLTTR is activated in response to the fall of clock signal CLK in this clock cycle (state (I)), while on the other hand, when position information PI is at the H level, latch transfer instructing signal ZLTTR is generated in response to the rise of clock signal CLK in the next clock cycle (state (II)).

When the write command is supplied, write operation mode instructing signal φwr is activated once again, and a similar operation is performed. In the next clock cycle, the position information is generated according to the logic level of data strobe signal DQS, and latch transfer instructing signal ZLTTR is generated according to the generated position information.

Thus, for each data write operation, position information is regularly generated so that the data latch transfer timing can be adjusted accurately according to the operating environment, and the internal write data can be transferred with accuracy.

As described above, according to the first embodiment of the present invention, the data latch transfer timing is adjusted according to the position of the memory with respect to the controller so that the latch and transfer of the internal write data can be performed accurately even when the flight time differs for each memory.

Second Embodiment

Figure 21:
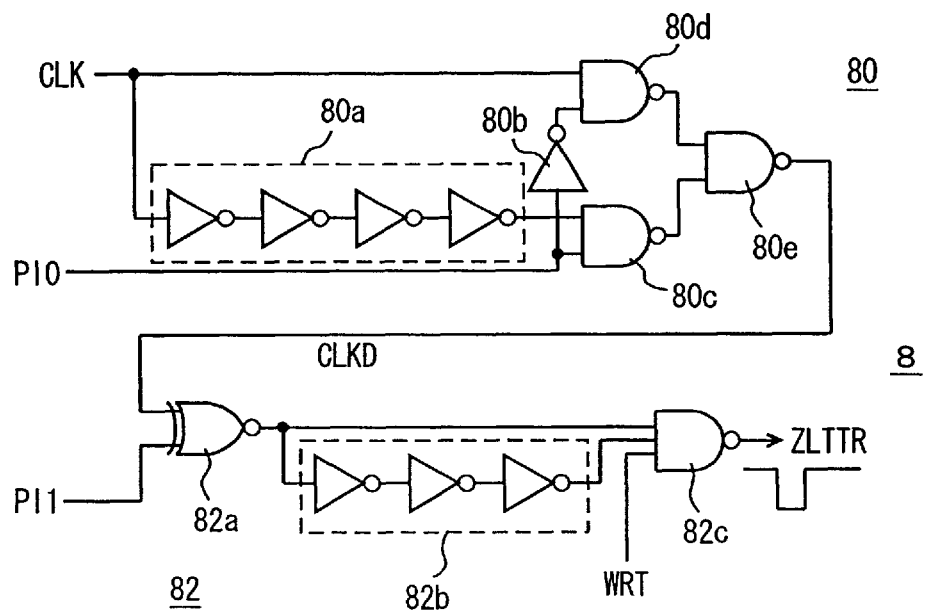
FIG. 21 is a diagram representing another arrangement of the input control circuit shown in FIG. 1.

FIG. 21 is a schematic diagram representing an arrangement of an input control circuit 8 according to the second embodiment of the present invention. In input control circuit 8 shown in FIG. 21, a latch transfer instructing signal ZLTTR is generated according to two bit position information. In FIG. 21, input control circuit 8 includes a variable delay circuit 80 for delaying a clock signal CLK according to position information PI0, and a pulse generating circuit 82 for generating latch transfer instructing signal ZLTTR according to an output signal CLKD from variable delay circuit 80, position information PI1, and a write activating signal WRT.

Variable delay circuit 80 includes a delay circuit 80a for delaying clock signal CLK (an internal clock signal CLKi) by a prescribed period of time, an inverter 80b for inverting position information PI0, an NAND circuit 80c receiving an output signal from delay circuit 80a and position information PI0, an NAND circuit 80d receiving an output signal from inverter 80b and clock signal CLK, and an NAND circuit 80e receiving output signals from NAND circuits 80d and 80c to generate output signal CLKD.

When position information PI0 is at the H level, the output signal from inverter 80b attains the L level, and the output signal from NAND circuit 80d is fixed to the H level, while NAND circuits 80c and 80e each operate as an inverter and delay the clock signal CLK to generate output signal CLKD.

When position information PI0 is at the L level, the output signal from NAND circuit 80c is fixed to the H level, and the output signal from inverter 80b attains the H level. Consequently, in this case, clock signal CLK is output with a delay of the gate delay by NAND circuits 80d and 80e.

Pulse generating circuit 82 includes an EXNOR circuit 82a receiving output signal CLKD from variable delay circuit 80 and position information PI1, an inverting delay circuit 82b for inverting and delaying, by a prescribed period of time, an output signal from EXNOR circuit 82a, and NAND circuit 82c receiving the output signal from EXNOR circuit 82a, an output signal from inverting delay circuit 82b, and a write activating signal WRT to generate latch transfer instructing signal ZLTTR.

When position information PI1 is at the H level, EXNOR circuit 82a operates as a buffer circuit and generates its output signal according to output signal CLKD from variable delay circuit 80. On the other hand, when position information PI1 is at the L level, EXNOR circuit 82a operates as an inverter and inverts output signal CLKD from variable delay circuit 80.

Inverting delay circuit 82b and NAND circuit 82c operate as a one-shot pulse generating circuit for generating a one-shot pulse signal in response to the rise of the output signal from EXNOR circuit 82a when write activating signal WRT is activated. Thus, in this one-shot pulse generating circuit 82, it is determined at which of the rising and falling edges of output signal CLKD from variable delay circuit 80 a one-shot pulse should be generated based on position information PI1.

Figure 22:
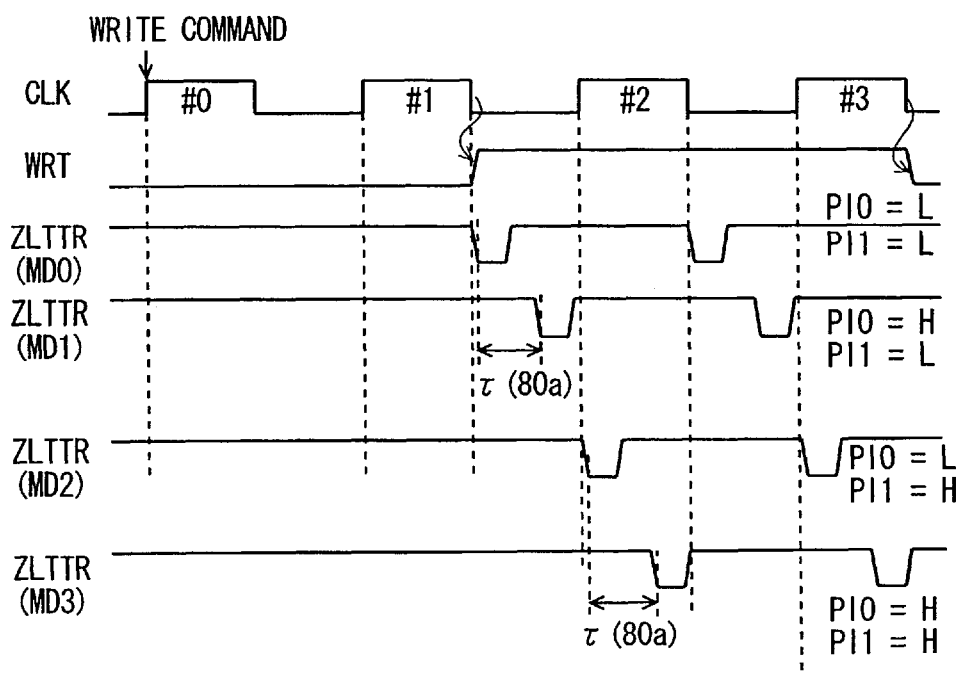
FIG. 22 is a timing chart representing an operation of the input control circuit shown in FIG. 21.

FIG. 22 is a timing chart representing an operation of input control circuit 8 shown in FIG. 21. The operation of input control circuit 8 shown in FIG. 21 will be described below with reference to FIG. 22.

Where PI0=PI1=L level　　　　　　　　　　　　　　　(1)

When position information PI0 and PI1 are both set to the L level, variable delay circuit 80 generates output signal CLKD according to clock signal CLK, and pulse generating circuit 82 generates a one-shot pulse signal in the activation of write activating signal WRT in response to the fall of output signal CLKD.

Thus, in the case when a write command is supplied in clock cycle #0, when write activating signal WRT is activated in response to the fall of clock signal CLK of clock cycle #1, latch transfer instructing signal ZLTTR is activated in response to the fall of clock signal CLK. The activation of the latch transfer instructing signal is performed in clock cycles #1 and #2. Here, it is assumed that the burst length is four and write activating signal WRT is held in the active state for two clock cycle period.

Where PI0=H level and PI1=L level　　　　　　　　　(2)

In this state, variable delay circuit 80 delays clock signal CLK by a delay time $\tau(80a)$ of delay circuit 80a and generates output signal CLKD. Here, the gate delay is ignored. Pulse generating circuit 82 generates a one-shot pulse in response to the fall of output signal CLKD from variable delay circuit 80.

Therefore, when a write command is supplied in clock cycle #0, and write activating signal WRT is activated in response to the fall of clock signal CLK in clock cycle #1, latch transfer instructing signal ZLTTR is activated after delay time $\tau(80a)$ of delay circuit 80a passes. Similarly, in clock cycle #2, latch transfer instructing signal ZLTTR is activated after delay time $\tau(80a)$ from the fall of clock signal CLK.

Where PI0=L level and PI1=H level  (3)

In this state, variable delay circuit 80 generates output signal CLKD according to clock signal CLK, and pulse generating circuit 82 generates a one-shot pulse signal in response to the rise of output signal CLKD.

Thus, when a write command is supplied in clock cycle #0, and when write activating signal WRT is activated in response to the fall of clock signal CLK in clock cycle #1, the latch transfer instructing signal is activated in response to the rise of clock signal CLK in clock cycle #2. Since the burst length is four, latch transfer instructing signal ZLTTR is activated in response to the rise of clock signal CLK in the next clock cycle #3 as well.

Where PI0=PI1=H level  (4)

In this state, variable delay circuit 80 delays clock signal CLK by delay time $\tau(80a)$ of delay circuit 80a and generates output signal CLKD. Pulse generating circuit 82 generates a one-shot pulse signal in response to the rise of output signal CLKD.

Thus, when a write command is supplied in clock cycle #0 and write activating signal WRT is activated in response to the fall of clock signal CLK in clock cycle #1, latch transfer instructing signal ZLTTR is activated when delay time $\tau(80a)$ elapses since the rise of clock signal CLK in each of clock cycles #2 and #3.

By changing the values of position information PI0 and PI1 of each of memories MD0 to MD3, the timing at which latch transfer instructing signal ZLTTR is activated can be varied internally. Thus, the latch timings inside the memories can be adjusted more finely according to the distances from the controller. Thus, even in the case where clock signal CLK is modified into a higher speed clock signal and the time difference of the flight times of signals/data between neighboring memories becomes significantly influential, by utilizing the two bit data for generating the position information to adjust the amount of delay, the write timing of the internal data can be set with accuracy.

Figure 23:
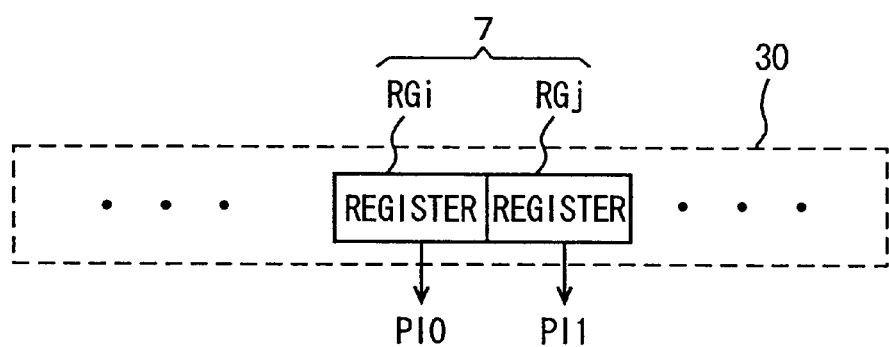
FIG. 23 is a diagram representing an example of an arrangement of a circuit for generating position information shown in FIG. 21.

FIG. 23 is a diagram representing an example of an arrangement of a circuit for generating position information PI0 and PI1. In FIG. 23, position information generating circuit 7 is formed by register circuits RGi and RGj included in a mode register circuit 30. By setting the respective stored data to register circuits RGi and RGj in this mode register circuit according to a mode register set command, position information PI0 and PI1 are generated.

The mode register set command is supplied from the controller, and position information of two bits is stored in a table memory 31 shown in FIG. 11 in correspondence with each memory number, and position information PI0 and PI1 for each memory is set in the initializing sequence under the control of the controller. The operation of the initializing sequence at this time is the same as the flow chart shown in FIG. 12. Thus, by utilizing mode register circuit 30, the position information according to the position of each memory can be set with accuracy under the control of the controller.

Figure 24:
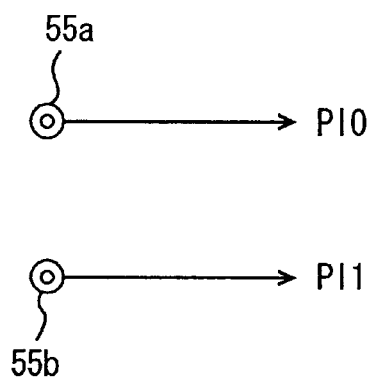
FIG. 24 is a schematic diagram representing another arrangement of the circuit for generating position information shown in FIG. 21.
Figure 25:
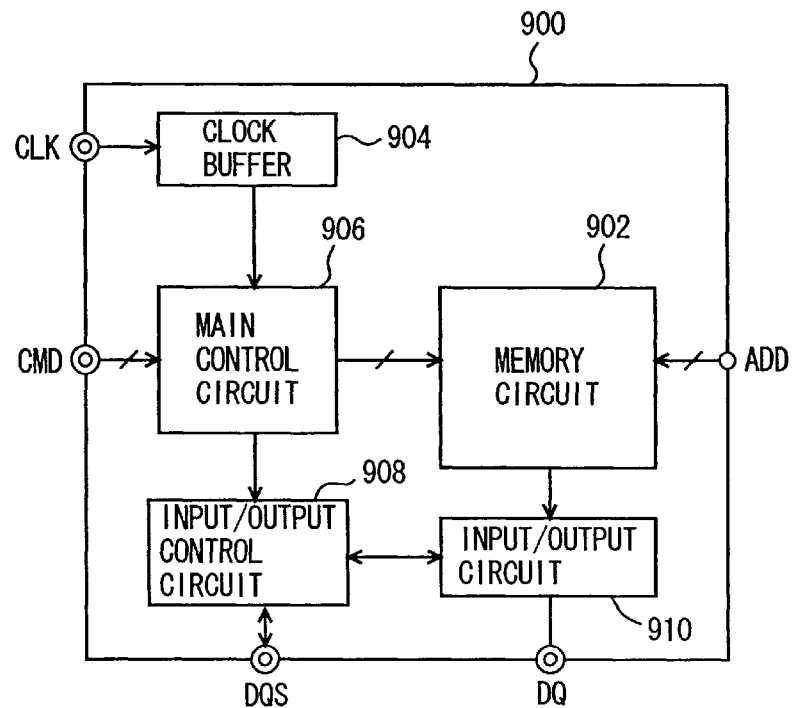
FIG. 25 is a schematic diagram representing an overall configuration of a conventional semiconductor memory device.

FIG. 24 is a schematic diagram representing a modification of position information generating circuit 7 for generating multi-bit position information. In FIG. 24, position information PI0 and PI1 are supplied via external terminals 55a and 55b. Specifically, in the arrangement shown in FIG. 24, these position information setting terminals 55a and 55b are connected to an on-board power supply line and an on-board ground line according to an associated memory position when mounted on a mother board as a memory module as shown in FIG. 14. A socket is installed on the board in a fixed manner, and upon mounting of the sockets onto the mother board, the position information setting terminals of each socket are connected to a ground line and a power supply line according to the mounting position of the socket in advance. Thus, the position information of each memory can be set by simple insertion into the socket upon assembly of the memory module.

In the foregoing description, two bit position information is utilized as the position information. The position information having a greater number of bits such as three bit position information or four bit position information may be utilized, as long as an arrangement can be utilized for setting the multi-bit position information in a dedicated register circuit in a mode register set mode.

As described above, according to the second embodiment of the present invention, multi-bit position information is set, and the activation timing of the latch transfer instructing signal is set for each of the memories so that the internal write data can be generated with accuracy. Therefore, even in a very high speed bus system in which the cycle of an external clock signal is substantially the same or shorter than the flight time on a data bus, data can be taken in with accuracy to generate the internal write data, and a stable memory operation can be ensured.

Moreover, in the first and second embodiments, the internal write data transfer is performed according to a data latch transfer instructing signal, and the activation timing of the latch transfer instructing signal is adjusted according to the memory position. Thus, there is no need to signal the receiver side of the data write timing particularly by setting the preamble of data strobe signal DQS as long as one cycle, and the data write operation can be performed at each clock cycle successively for different memories. This is because there is no need to transfer the preamble of the data strobe signal for each of the different memories.

In the above description, a latch transfer instructing signal is generated for the circuit portion for generating parallel data in a circuit that internally serial to parallel converts in a DDR mode clock synchronous semiconductor memory device. In an SDR memory that operates in a single data rate mode in which the data transfer is performed at a rising edge or a falling edge of a clock signal, however, in the case where data write operation is performed in a burst mode, the above-described latch transfer instructing signal may be supplied to a circuit portion that performs take-in of data and generation of the internal write data. Even in an SDR mode DRAM, accurate generation of internal write data in synchronization with a high speed clock signal can be ensured regardless of the memory position.

In other words, even in the data write operation of the SDR memory, the internal write data is transferred according to an internal clock signal. Therefore, by adjusting the activation timing of a write driver according to the latch transfer instructing signal, the data write operation can be performed with accuracy even with a high speed clock.

As described above, according to the present invention, the timing at which the internal write data is generated is adjusted according to the position information of the memory depending on the memory position. Thus, even in the case where the flight time of a signal/data becomes substantially the same as the cycle time of a clock signal, the internal write data can be generated with accuracy, and a stable operation of the memory can be ensured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device operating according to a control signal from a controller, comprising:

position information generating circuitry for generating position information indicating a position on the basis of said controller;

data take-in instructing signal generating circuitry for adjusting a timing for taking in data received from said controller to generate a data take-in instructing signal in accordance with the position information generated from said position information generating circuitry and a write instructing signal supplied from said controller; and write circuitry for generating internal data corresponding to the data received from said controller according to said data take-in instructing signal.

2. The semiconductor memory device according to claim 1, wherein said position information generating circuitry includes a register circuit for taking in and storing the position information supplied from said controller.

3. The semiconductor memory device according to claim 1, wherein said position information generating circuitry generates said position information according to data externally applied in a fixed manner to a predetermined terminal.

4. The semiconductor memory device according to claim 1, wherein said semiconductor memory device is configured to operate in synchronization with a clock signal, and said position information generating circuitry comprises a circuit for generating said position information in accordance with a phase relation between a prescribed signal applied from said controller and said clock signal.

5. The semiconductor memory device according to claim 1, wherein said semiconductor memory device is configured to operate in synchronization with a clock signal, and said position information generating circuitry generates said position information according to a logic level of a prescribed signal applied from said controller at a transition point of said clock signal.

6. The semiconductor memory device according to claim 1, wherein said semiconductor memory device is configured to operate in synchronization with a clock signal, and said position information generating circuitry takes in a prescribed signal applied in synchronization with said clock signal from said controller in response to a position information setting instruction applied from said controller and generates said position information according to the prescribed signal taken in.

7. The semiconductor memory device according to claim 1, wherein said semiconductor memory device is configured to operate in synchronization with a clock signal, and said position information generating circuitry takes in a prescribed signal applied in synchronization with said clock signal from said controller in response to a data access instruction applied from said controller and generates said position information according to the prescribed signal taken in.

8. The semiconductor memory device according to claim 1, wherein said semiconductor memory device is configured to operate in synchronization with a clock signal, and said position information generating circuitry generates a delay amount setting signal for setting an amount of delay of said clock signal as said position information.

9. The semiconductor memory device according to claim 8, wherein said position information generating circuitry includes a circuit for storing delay amount setting data setting said amount of delay applied from said controller.

10. The semiconductor memory device according to claim 8, wherein said position information generating circuitry generates said delay amount setting signal according to a fixed voltage supplied to a prescribed terminal.

11. The semiconductor memory device according to claim 1, wherein said semiconductor memory device is configured to operate in synchronization with a clock signal, and said position information generating circuitry generates, as said position information, an edge selecting signal for designating which of a rising edge of and a falling edge of said clock signal is to be selected.

12. The semiconductor memory device according to claim 11, wherein said position information generating circuitry includes a circuit for storing edge designating data applied from said controller to generate said edge selecting signal.

13. The semiconductor memory device according to claim 11, wherein said position information generating circuitry generates said edge selecting signal to a voltage of a prescribed terminal.

* * * * *